United States Patent [19]
Oowaki et al.

[11] Patent Number: 5,499,209
[45] Date of Patent: Mar. 12, 1996

[54] INTEGRATED SEMICONDUCTOR MEMORY WITH INTERNAL VOLTAGE BOOSTER OF LESSER DEPENDENCY ON POWER SUPPLY VOLTAGE

[75] Inventors: Yukihito Oowaki, Yokohama; Daisaburo Takashima, Kawasaki; Masako Ohta, Yokohama, all of Japan

[73] Assignee: Kabushiki Kaisha Toshiba, Kawasaki, Japan

[21] Appl. No.: 457,738

[22] Filed: Jun. 1, 1995

Related U.S. Application Data

[60] Continuation of Ser. No. 182,397, Jan. 18, 1994, abandoned, which is a division of Ser. No. 708,362, May 31, 1991, Pat. No. 5,307,315.

[30] Foreign Application Priority Data

Jun. 1, 1990 [JP] Japan ................................. 2-141686

[51] Int. Cl.$^6$ ......................... G11C 7/00; H03K 17/687
[52] U.S. Cl. ................... 365/189.11; 365/189.09; 365/226; 365/230.06; 327/390; 327/536
[58] Field of Search ................. 365/226, 230.06, 365/227, 189.09, 189.11; 307/482, 578, 296.2; 327/390, 534, 536

[56] References Cited

U.S. PATENT DOCUMENTS 3,889,135  6/1975  Nomiya et al. ................. 307/482
4,500,799  2/1985  Sud et al. ................. 365/230.06 X
4,896,297  1/1990  Miyatake et al. ................. 365/230.06 X
5,124,631  6/1992  Terashima ................. 365/189.09 X Primary Examiner—David C. Nelms
Assistant Examiner—Son Dinh
Attorney, Agent, or Firm—Oblon, Spivak, McClelland, Maier & Neustadt

[57] ABSTRACT

A word-line drive voltage generation circuit for use in a dynamic random-access memory is disclosed which is connected to a word line via a row decoder including MOS transistors. The circuit includes a charge-bootstrap capacitor having insulated electrodes, one of which is connected to a first reference voltage generator via a switching MOS transistor, and the other of which is connected via a MOS transistor to a second reference voltage generator. These voltage generators provide the capacitor with the constant d.c. voltage that are essentially insensitive to variation in the power supply voltage for the memory. The resultant word-line drive voltage may thus be free from variation in the power supply voltage during the operation modes of the memory. This enables the word-line voltage to be high enough to allow successful "H" level writing at a selected memory cell without creation of any unwantedly increased dielectric breakdown therein, in the entire allowable range of the power supply voltage.

9 Claims, 16 Drawing Sheets

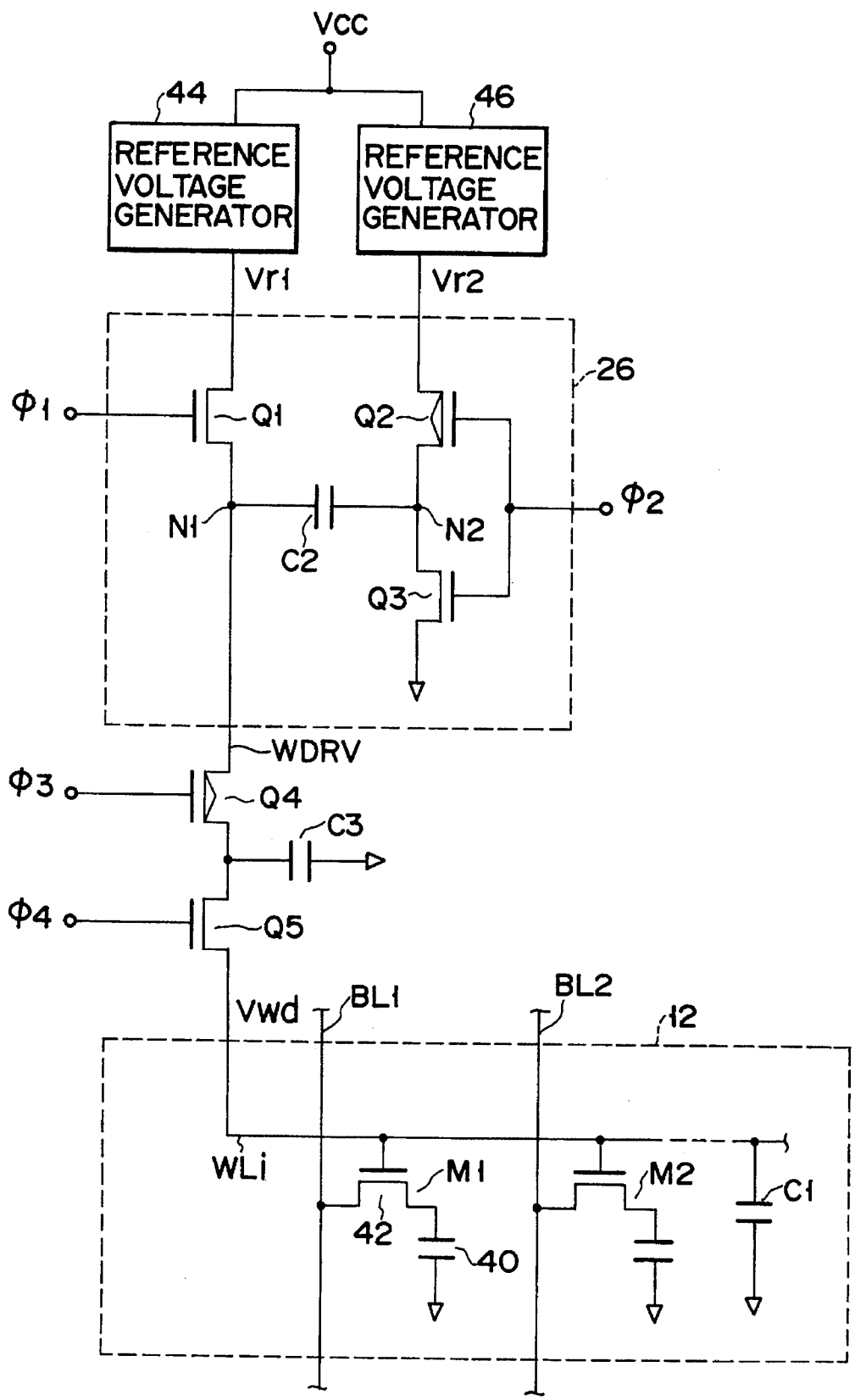
F I G. 2

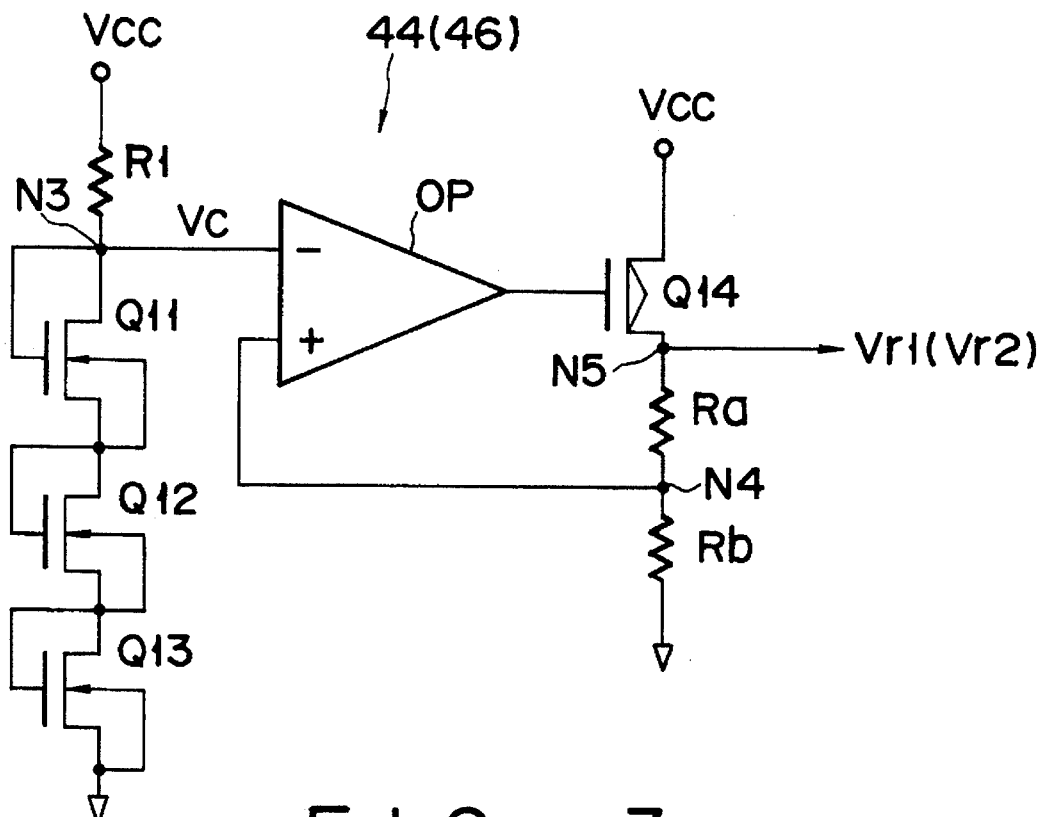
F I G. 3
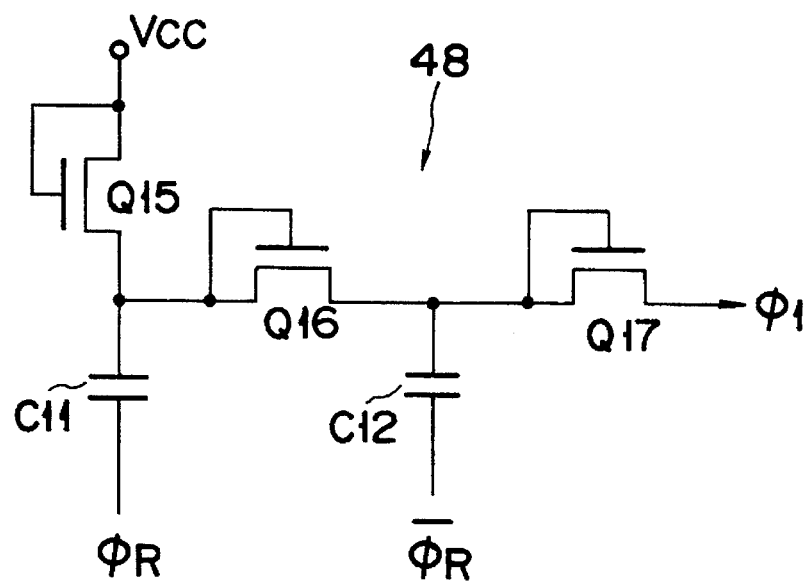
F I G. 4

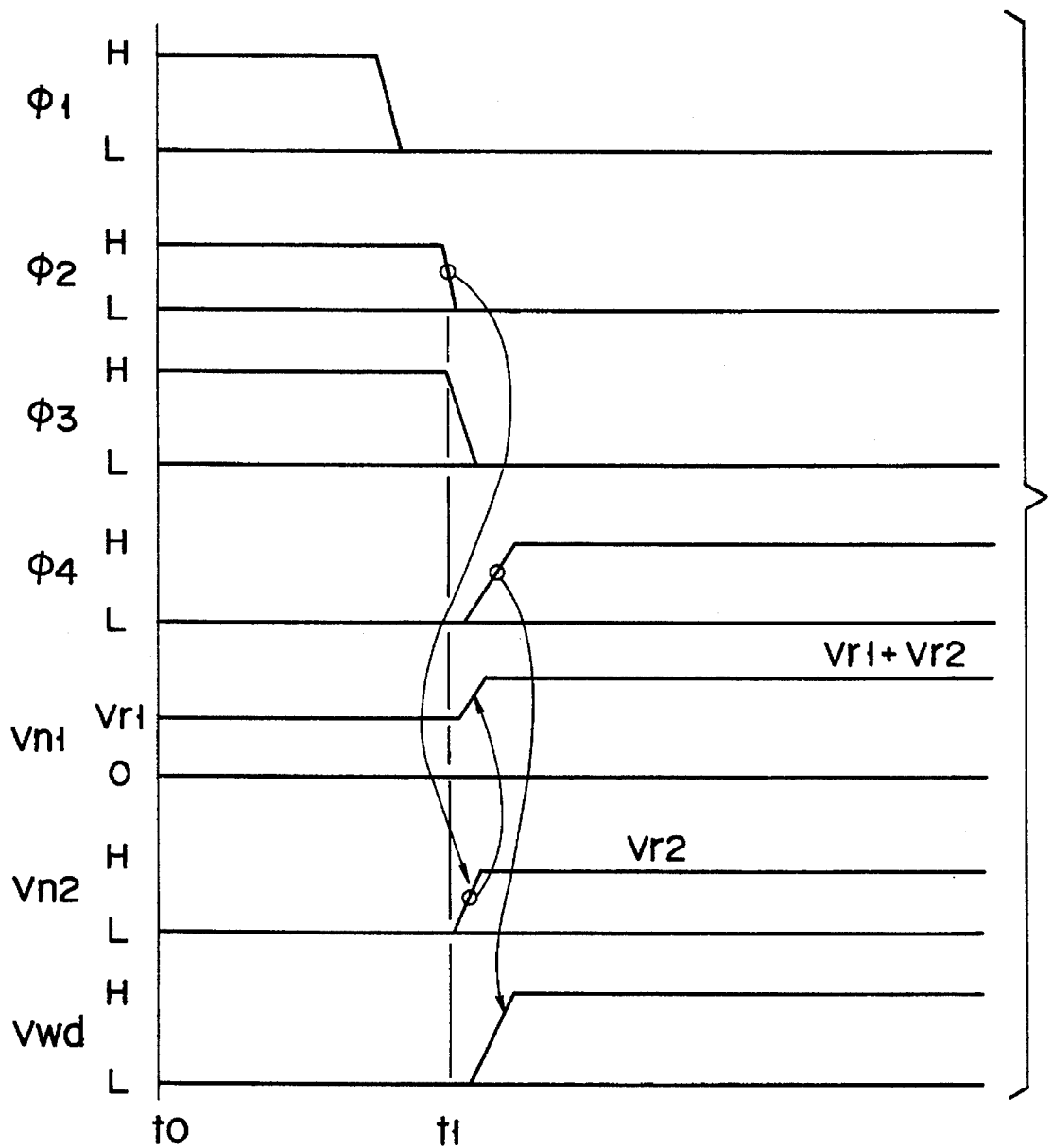
F I G. 5

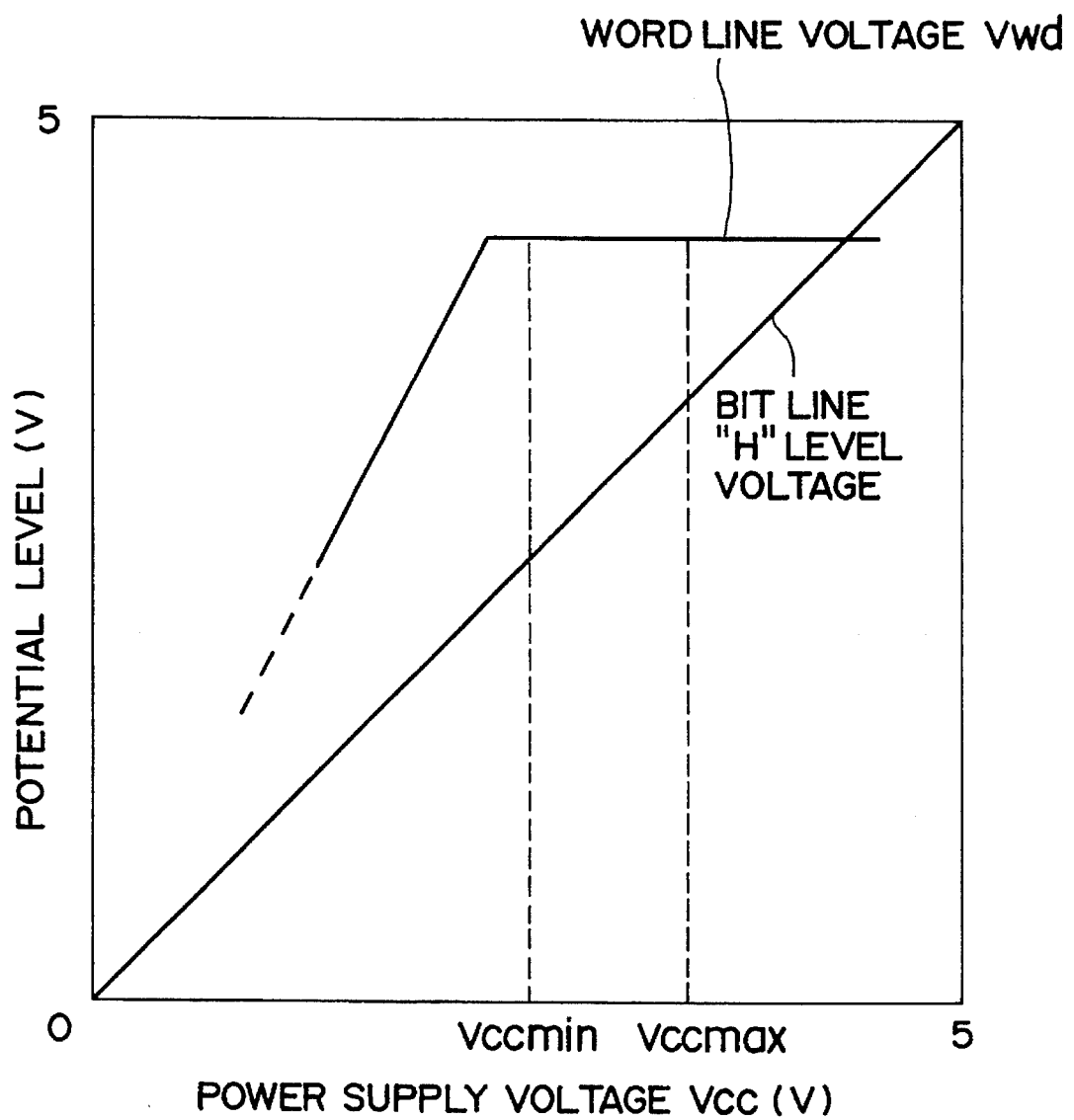
F I G. 6

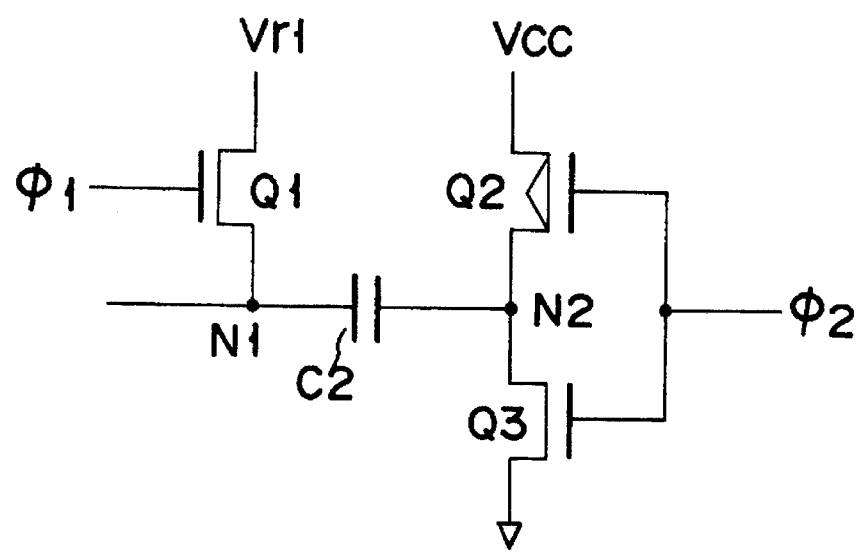
F I G. 7
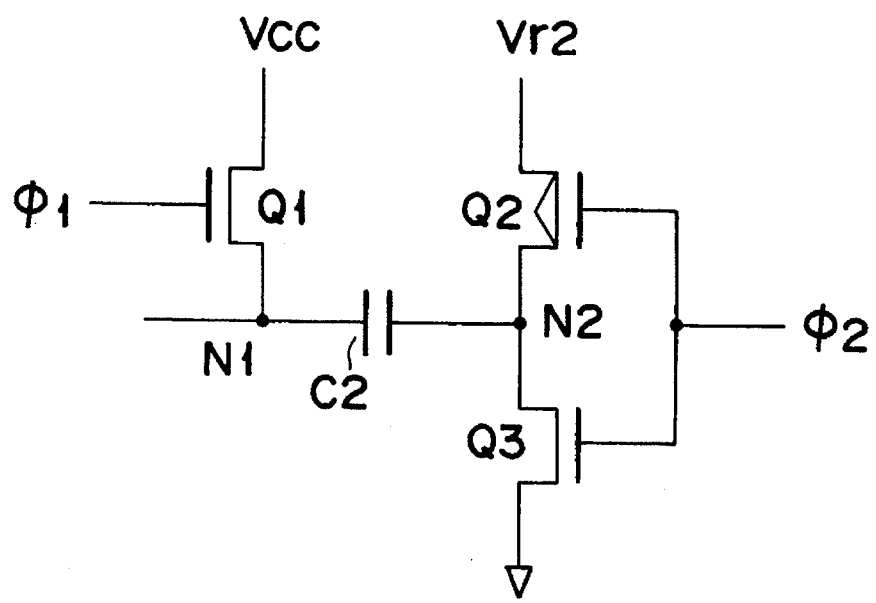
F I G. 8

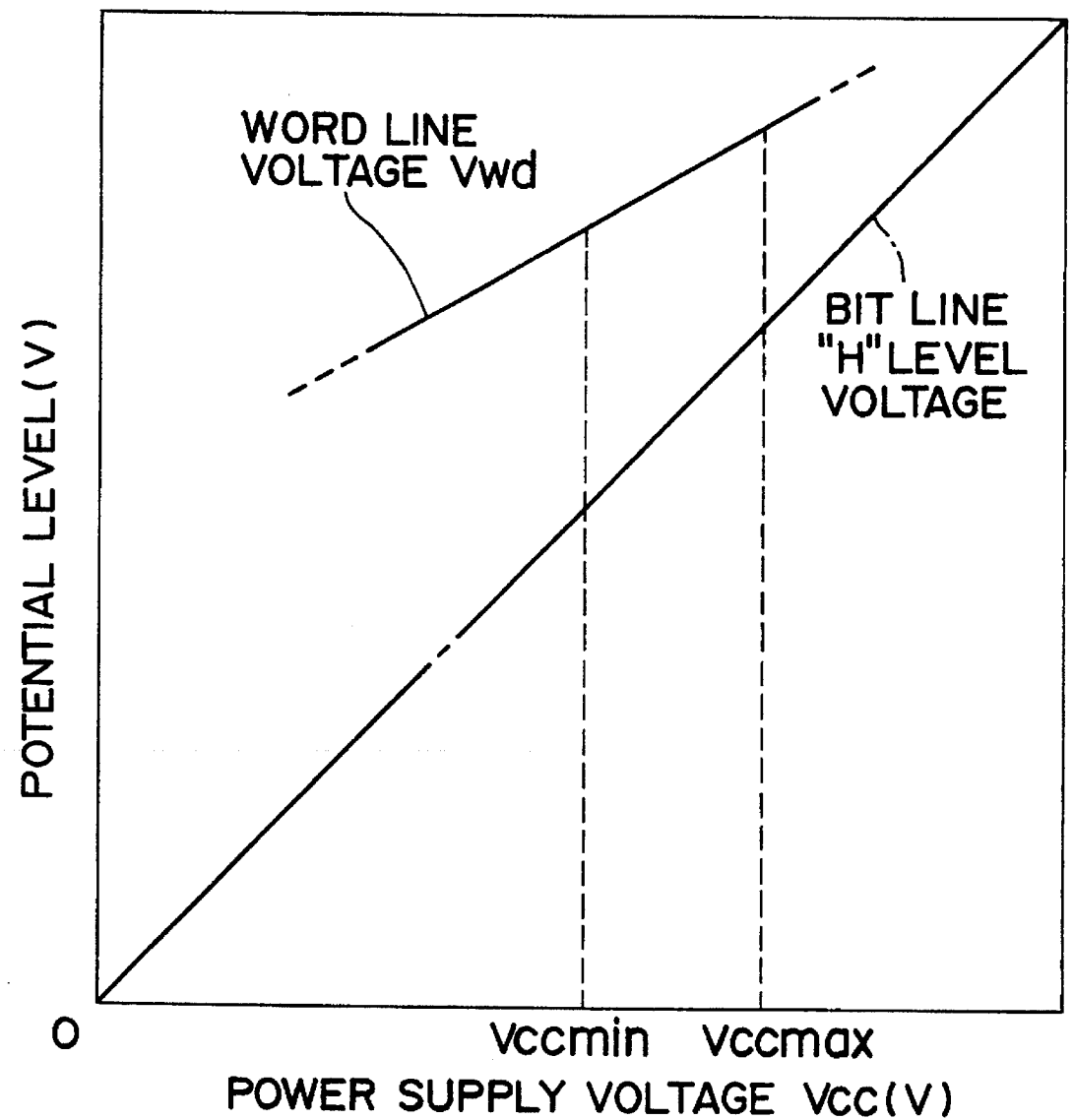
F I G. 9

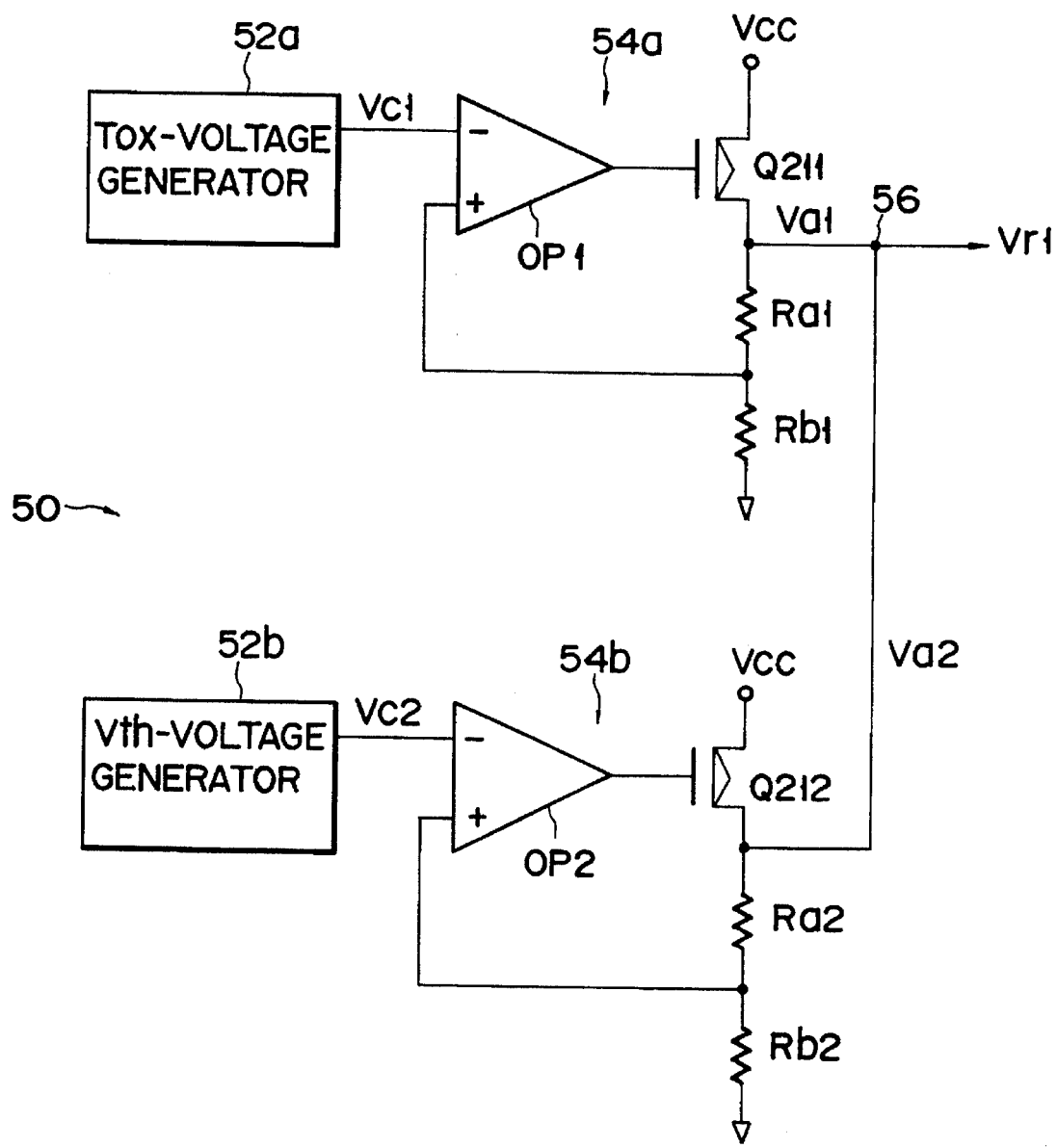
F I G. 10

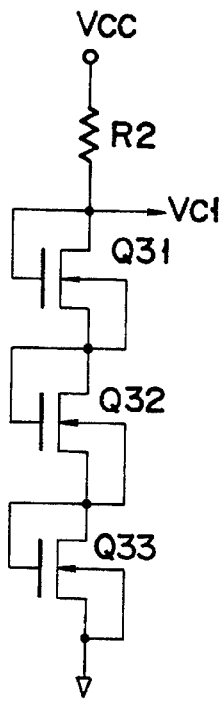 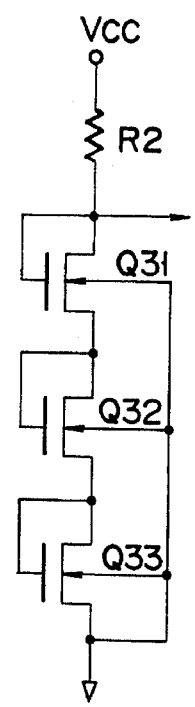 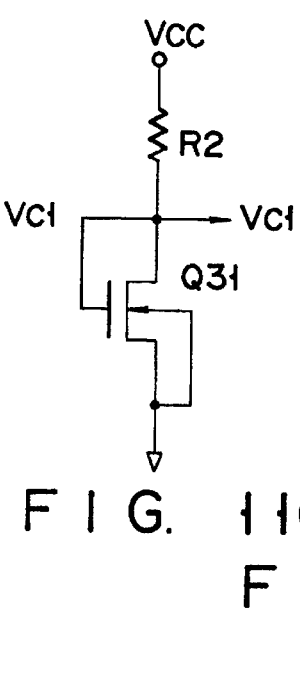 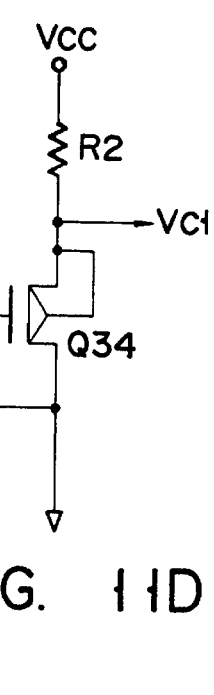
F I G. 11A   F I G. 11B   F I G. 11C   F I G. 11D
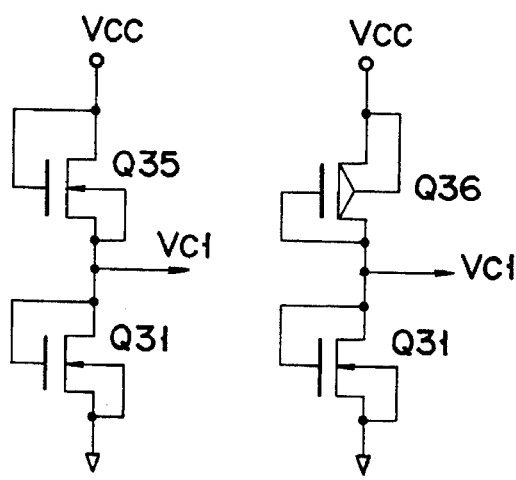
F I G. 11E   F I G. 11F

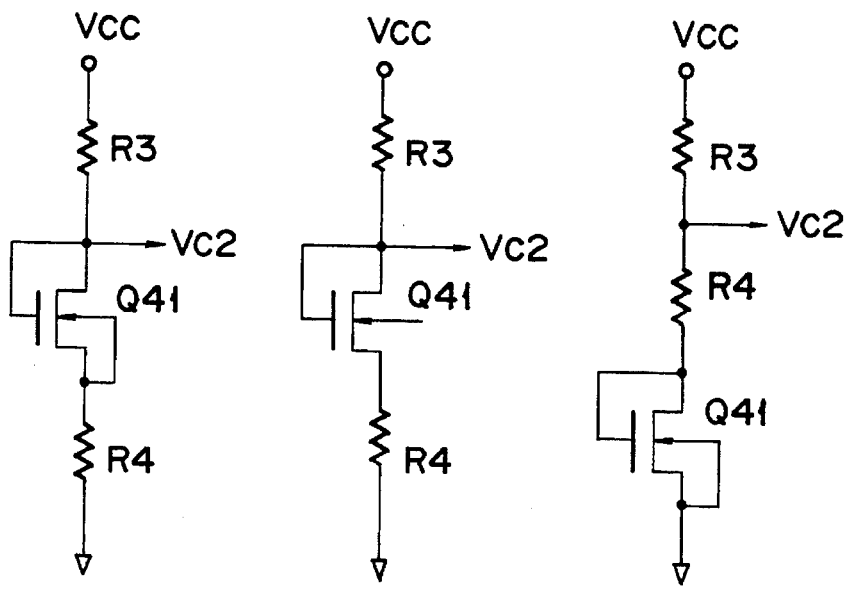
F I G. 13A   F I G. 13B   F I G. 13C
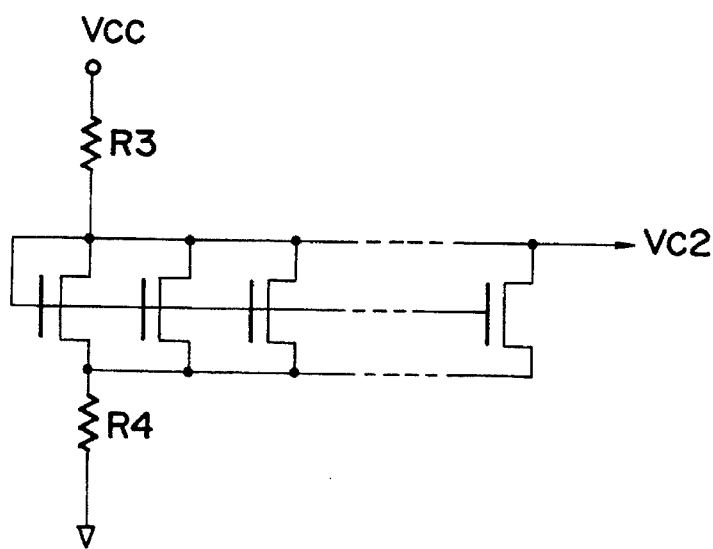
F I G. 13D

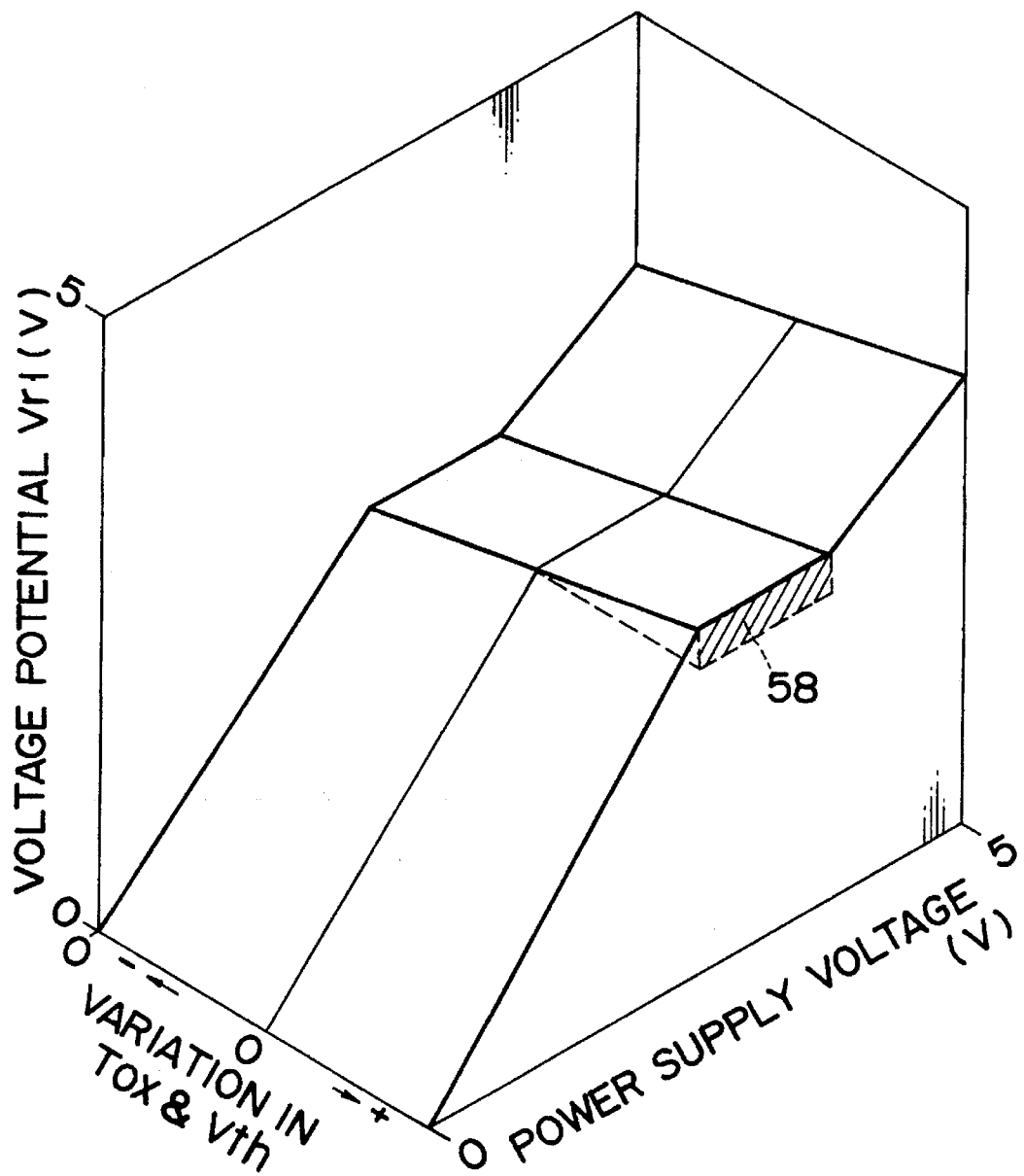
F I G. 16

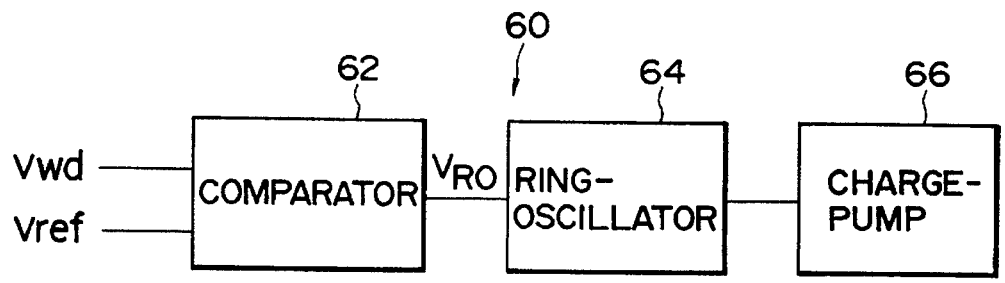
F I G. 18
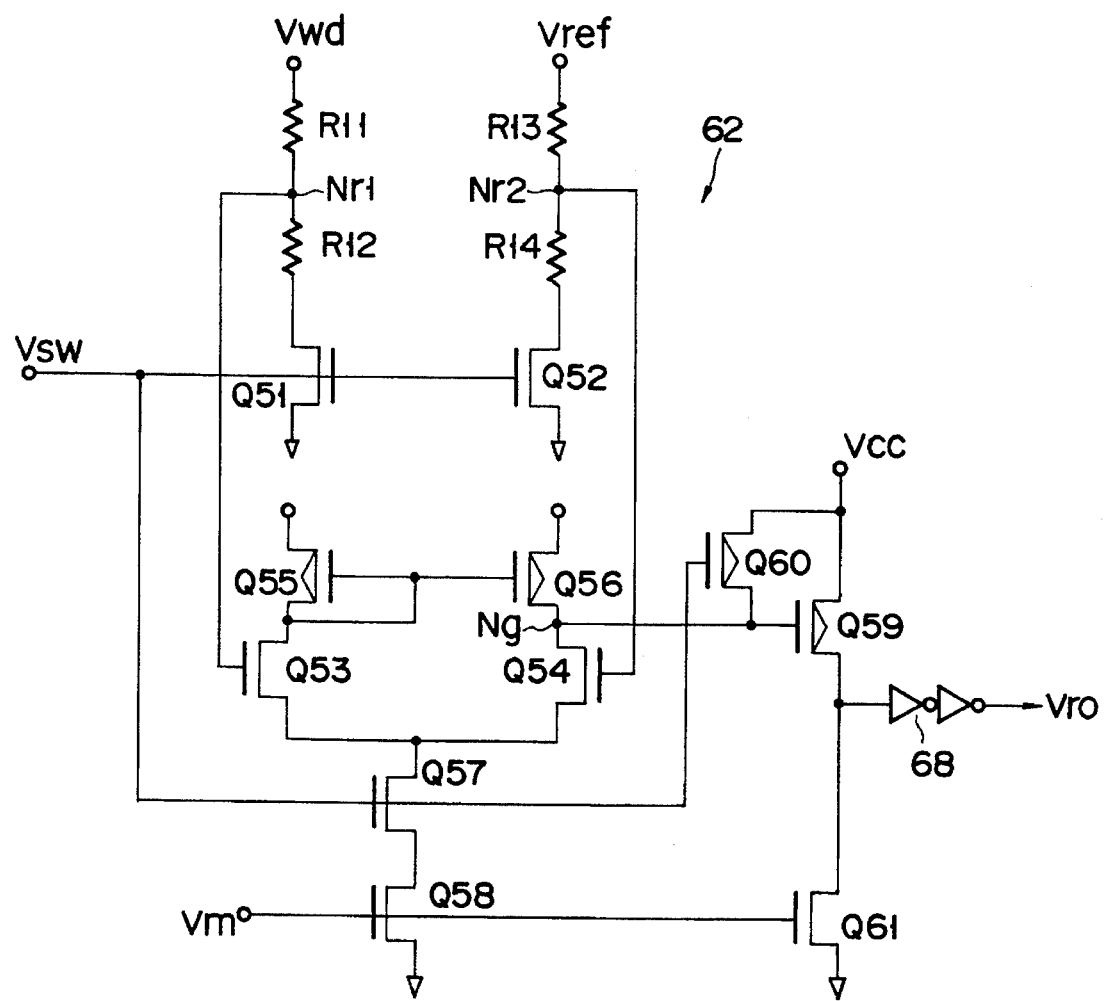
F I G. 19

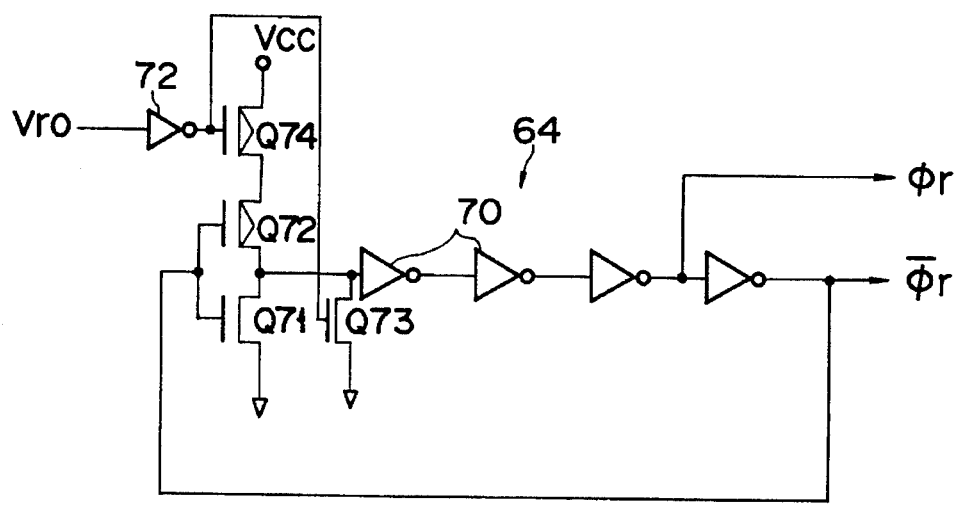
F I G. 20
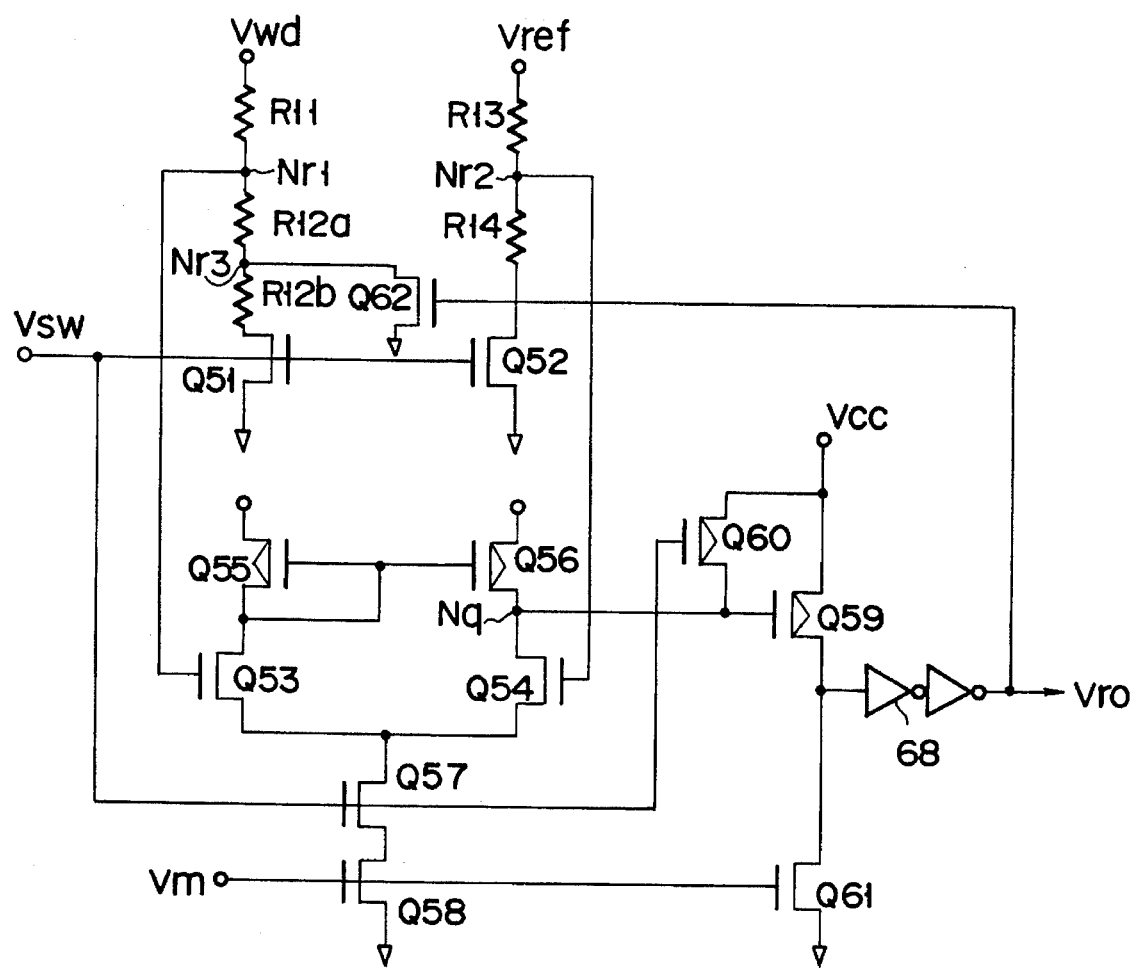
F I G. 21

INTEGRATED SEMICONDUCTOR MEMORY WITH INTERNAL VOLTAGE BOOSTER OF LESSER DEPENDENCY ON POWER SUPPLY VOLTAGE

This application is a continuation of application Ser. No. 08/182,397, filed on Jan. 18, 1994, now abandoned, which is a divisional application of Ser. No. 07/708,362, filed on May 31, 1991, now U.S. Pat. No. 5,307,315.

BACKGROUND OF THE INVENTION

1. Field of the Invention

The present invention generally relates to integrated semiconductor memory devices, and more particularly to a dynamic random-access memory including a circuit arrangement for generating a potential-raised or boosted voltage employed to drive word lines thereof.

2. Description of the Related Art

With the increasing needs for high performance and reliability of digital computer systems, development of a semiconductor memory with a large capacity has been demanded strongly. The design of dynamic random-access memories (DRAMs) has been developed along with such a trend. A presently available DRAM includes an array of memory cells that are arranged in rows and columns. Each memory cell has a capacitor and an insulated-gate transistor such as a metal-oxide-semiconductor field-effect transistor (MOSFET). The capacitor acts as a data storage element; the transistor serves as a data transfer gate.

Parallel data transfer lines are provided and connected to the current carrying electrodes of cell transistors in columns of memory cells parallel control lines are associated with the control electrodes of rows of memory cells. When a control line is activated, and a certain data transfer line is selected, the transistor in a selected memory cell is rendered conductive to "transfer" digital information from a corresponding data transfer line to the cell capacitor therein. The information is thus stored in the selected memory cell. The data transfer lines are called "bit lines"; the control lines are called "word lines."

A high ("H") voltage that is supplied via the word lines to the control gates of memory cell transistors should be arranged to be potentially greater in magnitude than the information voltage of high level on the bit lines. The difference between the voltages is necessary in order to compensate for a potential drop of a word-line drive voltage due to the threshold voltages of the memory cell transistors. The high voltage is generated using a specific capacitor that is arranged within a word-line drive circuit. The capacitor may act as the "booting" or bootstrap capacitor for producing a word-line drive voltage that is higher than the power supply voltage Vcc of DRAM.

Generally, the bootstrap capacitor is precharged at its one electrode toward the power supply voltage; the other electrode thereof is initially at the ground potential, and then driven to rise up to the power supply voltage, thereby producing the word-line drive voltage of a suitable potential level with such a voltage booting system, a difference arises between the dependency of the bit-line "H" level voltage on the power supply voltage, and that of the word-line "H" level voltage on the same. More specifically, the changing rate of the word-line "H" level voltage to the power supply voltage being varied is normally greater than that of the bit-line "H" level voltage. Assuming that the power supply voltage Vcc varies within the allowable range defined between the minimum voltage Vccmin and the maximum voltage Vccmax, the "H" level voltage on word lines increases more rapidly than the "bit-line H" level voltage does. As a result, the potential difference between these "H" voltages can no longer hold a constant value.

If the potential difference were arranged to have a desired value at the minimum power supply voltage Vccmin, when the power supply voltage is at the maximum level Vccmax, the word-line "H" level voltage goes beyond its limit value. This applies unnecessary potential stress to the gate insulation layers of the cell transistors; in the worst case, these cell transistors will be dielectrically broken down. Such undesirable phenomenon has been known as the "time dependent dielectric breakdown (TDDB)" among those skilled in the art.

On the contrary, to eliminate the TDDB phenomenon, it may be considered that the above potential difference were set at a suitable value at the maximum level Vccmax. If this is the case, however, another problem arises. When the power supply voltage Vcc drops to the maximum level Vccmax, the word-line "H" voltage can no longer maintain a suitable potential level that is higher than the bit-line "H" voltage as required. This makes it insufficient, or impossible, for the word-line drive voltage to compensate for a potential decrease in the threshold values of the memory cell transistors. As a result, the "H" data-writing performance decreases in the DRAMs.

In the conventional DRAMs, the above-mentioned "TDDB" problem have not been so serious for the semiconductor manufacturers. This can be said because the memory integration density itself has been kept lower. Low density of memory cells may permit each cell to be designed rather roughly to be greater in the chip area and in the gate-insulation film thickness. The dielectric breakdown level of the cell transistors thus has been high enough to "absorb" the excess potential increase in the word-line drive voltage, when the power supply voltage Vcc varies at the maximum level Vccmax. However, this cannot be applied to the today's highly integrated DRAMs any more. As the number of bits increases in DRAMs, the cell size decreases, the gate insulation film thickness also decreases, and the magnitude of dielectric breakdown of the "transfer gate" transistor in each cell of necessity decreases. Therefore, it will become more difficult to eliminate the TDDB problem in the cell transistors and yet to provide high operating reliability in the entire region of the allowable variation range of the power supply voltage Vcc. The technical problem is a significant bar to development in highly integrated DRAMs.

SUMMARY OF THE INVENTION

It is therefore an object of the present invention to provide a new and improved semiconductor memory device.

It is another object of the present invention to provide a new and improved semiconductor memory device which is highly integrated and excellent in its performance and reliability.

In accordance with the above objects, the present invention is drawn to a specific integrated circuit for use with a semiconductor memory device having an array of rows and columns of memory cells. These memory cells are associated with bit lines and word lines. The circuit comprises first and second voltage generators. The first voltage generator provides a selected one of the word lines with a word-line drive voltage that is potentially high enough to enable write of a digital information of high level. The second voltage generator is connected to the first voltage generator, for receiving a power supply voltage, and for generating a specific voltage of a fixed potential that is essentially insensitive to a potential variation in the power supply voltage. The first voltage generator generates the drive voltage by performing a capacitive carrier storage using the specific voltage of fixed potential.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 2 is a diagram showing the main circuit configuration of a word line drive circuit in accordance with one preferred embodiment of the invention;

FIG. 3 shows the arrangement of one of reference voltage generator circuits shown in FIG. 2;

FIG. 4 is an electrical diagram of a charge-pumping circuit for generating a control signal to be supplied to a charge-up transistor in a booster circuit shown in FIG. 2;

FIG. 5 is an illustration of a timing diagram showing the pulse sequence for the operation of the embodiment of FIGS. 1 to 4;

FIG. 6 is a graphic representation of potential levels of several voltages versus power supply voltage Vcc for the word lines in the circuit of FIG. 2;

FIGS. 7 and 8 are diagrams showing modified circuit arrangements of a potential-raised word line voltage generating section in the circuit of FIG. 2;

FIG. 9 is a graphic representation of potential levels of several voltages versus power supply voltage Vcc in the circuits of FIGS. 7 and 8;

FIG. 10 is a diagram showing the main circuit configuration of a word line drive circuit in accordance with another embodiment of the invention;

FIGS. 11A through 11F are electrical schematic diagrams of several circuit arrangements that are preferably applied as one of the reference voltage generators in FIG. 10;

FIGS. 13A through 13D are electrical schematic diagrams of several circuit arrangements that are preferably applied as the other reference voltage generator in FIG. 10;

FIG. 16 is a three-dimensional graphic representation of the characteristic line of FIG. 15 versus variation in the gate insulation film thickness and the threshold voltage due to deviation in manufacturing process of DRAMs;

FIG. 18 is a block diagram of a leak compensation circuit in accordance with the third embodiment of the invention, which may be associated with one of the first and second embodiments;

FIG. 19 is a diagram showing the internal circuit arrangement of a comparator circuit in FIG. 18;

FIG. 20 is a diagram showing the internal circuit arrangement of a ring-oscillator circuit in FIG. 18; and FIG. 21 is a diagram showing a slightly modified internal circuit arrangement of the comparator circuit in FIG. 18.

DETAILED DESCRIPTION OF THE PREFERRED EMBODIMENTS

Figure 1:
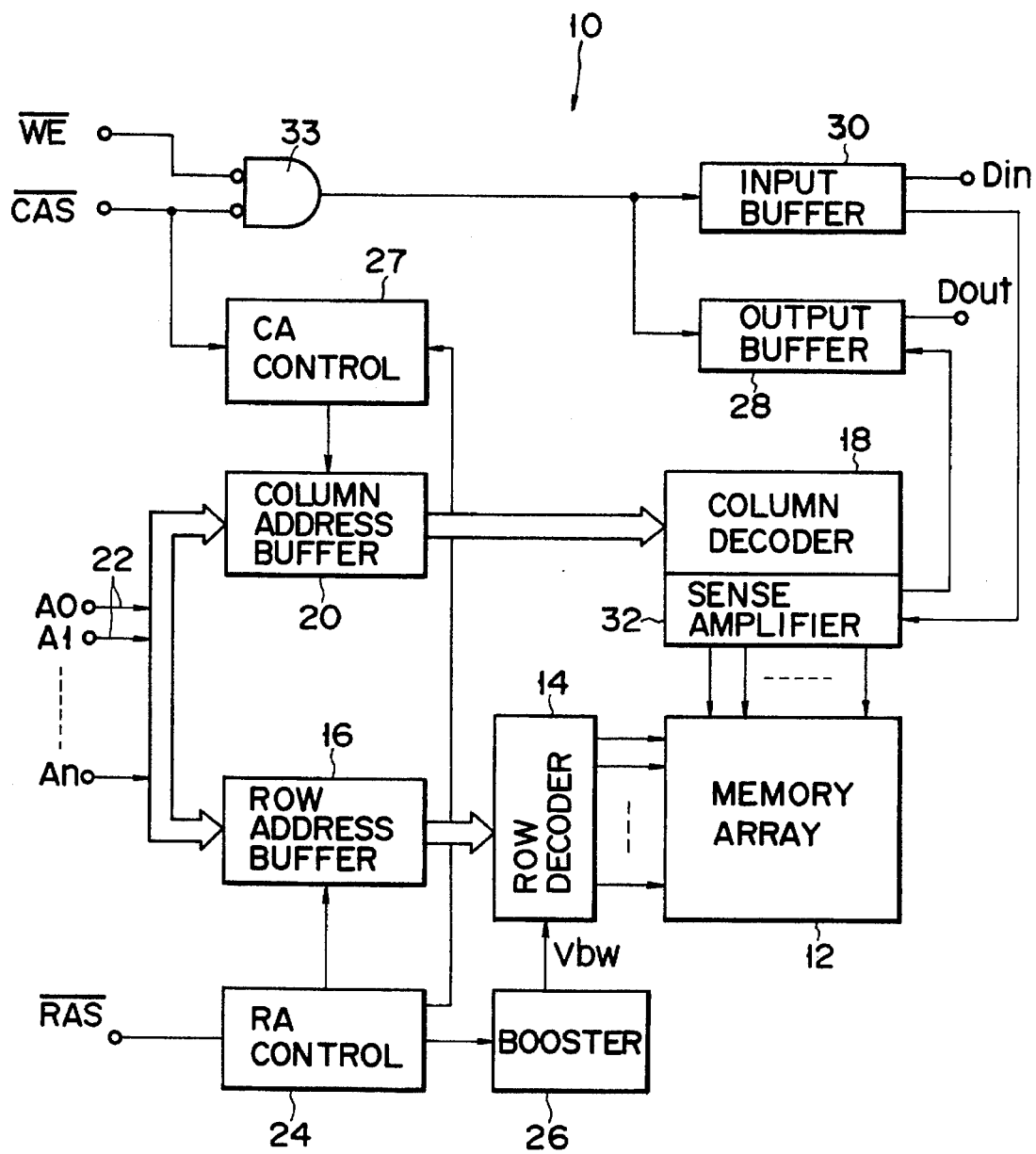
FIG. 1 is a block diagram of a random-access memory that embodies the invention.

Referring to FIG. 1, a random-access memory (DRAM) in accordance with one preferred embodiment of the present invention is generally designated by reference numeral "10." The DRAM 10 includes a memory cell array section 12 on its chip substrate. The section 12 includes an array of rewritable memory cells that are arranged in rows and columns. These memory cells are associated with parallel data transfer lines, and control lines that are insulatively cross the data transfer lines. The memory cells are arranged at the cross points of these lines. The data transfer lines may be called the "bit lines"; the control lines may be "word lines."

A row decoder 14 is connected to the word lines, for selecting one from the row lines (word lines) as determined by a row (or X) address stored in a row address latch or buffer 16. A column decoder 18 selects one of the column lines (bit lines) as determined by a column (or Y) address held in a column address buffer 20. These addresses include address bits A0, A1, . . . , An, and are applied to the buffers 16 and 20 by a predetermined bit number (n) of address lines 22 on a timeshare basis. The number n may be eight, sixteen, or thirty-two.

A control circuit 24 drives the row address buffer 16 in response to a row address strobe signal $\overline{RAS}$ input thereto; circuit 24 will be referred to as "RA controller." The output of RA controller 24 is applied to row decoder 14 via a voltage booster circuit 26 arranged on the chip substrate of DRAM 10. Booster circuit 26 generates a potential-increased (booted) voltage Vbw, which is employed to produce a word line drive signal. Another control circuit 27 is provided as a column address buffer controller (CA controller), which controls the buffering operation of column address buffer 20 in response to a column address strobe input $\overline{CAS}$. An input data buffer (or latch) 28 and an output data buffer 30 are connected to a known sense amplifier circuit 32, which is associated with the bit lines. A logic AND gate 33 is connected at its output to buffers 28 and 30. A write-enable ($\overline{WE}$) signal is supplied to a first input of AND gate 33; the $\overline{CAS}$ is supplied to CA controller 27 and a second input of AND gate 33.

As shown in FIG. 2, one word line WLi is associated with a preselected number of memory cells M1, M2, . . . Each memory cell M has a so-called "one-transistor" structure; it includes a capacitor 40 serving as a data storage element, and an insulated-gate transistor 42 that acts as a "transfer gate" between a corresponding data transfer line WLi and capacitor 40. The cell transistor 42 may be a metal-oxide-semiconductor field effect transistor (MOSFET). Cell transistor 42 has one current-carrying electrode (typically, drain electrode) connected to a corresponding one of the bit lines BL1, BL2, . . . . The same goes with the other memory cells. Cell transistors 42 included in one row of memory cells have control gate electrodes connected in common with a corresponding word line WLi. A capacitor C1 represents a parasitic capacitance which is inherent in the word line WLi; it will be referred as "word line capacitance."

A word line driver unit including the booster circuit 26 is connected by a wiring line WDRV to the memory cell array 12. This line will be called the "word-line drive line" hereinafter. Circuit 26 includes three MOS transistors Q1, Q2, Q3, and a capacitor C2. Capacitor C2 acts as "booting" or bootstrap capacitor, and produces a high voltage of increased potential. Transistor Q1 has a gate electrode connected to a control signal input $\phi 1$, and a drain electrode connected via a circuit node N1 to one electrode of bootstrap capacitor C2. Transistor Q1 may be an N-channel MOSFET of enhancement-type (E-type). Transistor Q1 performs an extra- or precharging function for capacitor C2. Transistors Q2 and Q3 are series-connected with their gate electrodes being connected together to a control signal input $\phi 2$. A common node N2 of transistors Q2 and Q3 is connected to the other electrode of capacitor C2. Transistors Q2 and Q3 constitute a capacitor potential-control section that controls the voltage potential at node N2. Transistor Q2 may be an E-type, P-channel MOSFET; transistor Q3 is an E-type, N-channel MOSFET.

As shown in FIG. 2, the transistor Q1 is connected at its source electrode to a first reference voltage generator circuit 44. Transistor Q2 is connected at the source electrode thereof to a second reference voltage generator circuit 46. First reference voltage generator 44 externally receives the power supply voltage Vcc of DRAM 10 to generate a preselected d.c. voltage as a first reference voltage Vr1. Second reference voltage generator 46 generates a second reference voltage Vr2 of a fixed potential level. Voltages Vr1 and Vr2 are the independent voltages which are essentially insensitive to any potential variation in the power supply voltage Vcc. These voltages are applied to the source electrodes of transistors Q1 and Q2, respectively.

Responding to the input control signal $\phi 1$, transistor Q1 turns on causing node N1 to be "precharged" toward voltage Vr1. Before an address is determined and assured, clock signal $\phi 2$ is at the "H" potential level. Node N2 is kept at the "L" level. After determination of address, control signal $\phi 2$ drops to a "low" potential level. Transistor Q2 is thus rendered conductive, while transistor Q3 is being kept nonconductive. The node N2 goes to reference voltage Vr2. A potential-raised or "booted" voltage appears at node N1 due to the capacitive coupling between nodes N1 and N2. The resultant voltage is developed onto word-line drive line WDRV, and then transmitted to the selected word line WLi through MOS transistors Q4 and Q5 that constitute a part of the row decoder 14. A capacitor C3 represents a total capacitance associated with a circuit section arranged between circuits 12 and 26; it contains a parasitic capacitance being inherent in line WDRV and an equivalent capacitance of transistors Q4 and Q5.

The reference voltage generators 44 and 46 may be arranged within the RA controller 24 together with the circuit for generating control signals $\phi 1$ and $\phi 2$. Reference voltage generator 44 is typically arranged as shown in FIG. 3, wherein three diode-connected N-channel MOSFETs Q11, Q12, and Q13 are connected in series to one end of a load resistor R1. The other end of resistor R1 is connected to the power supply voltage input Vcc. A node N3 between these MOSFETs and resistor R1 serves as a reference voltage-generating point. This node is connected to the inverting input of an operational amplifier OP. Amplifier OP has an output connected to the gate electrode of a P-channel MOSFET Q14. MOSFET Q14 is series-connected to voltage-dividing resistors Ra and Rb between the power supply voltage Vcc and the ground potential. A common node N4 of resistors Ra and Rb is connected to the non-inverting input of operational amplifier OP.

At the node N3 a voltage Vc appears which has a fixed potential level that has been determined by the threshold voltages of the three diode-connected MOSFETs Q11, Q12, Q13, and is essentially insensitive to variation in the power supply voltage Vcc. Operational amplifier OP amplifies the difference between voltage Vc and the voltage at the voltage-dividing node N4 of resistors Ra and Rb, thereby to generate the reference voltage Vr1. This voltage may be represented as follows:

$$Vr1 = Vc \cdot (Ra+Rb)/Rb. \tag{1}$$

The second reference voltage generator 46 is similar in its circuit arrangement to the first reference voltage generator 44. The number of diode-connected transistors and/or the circuit constants (e.g., design values of transistors, the gain of the operational amplifier, etc.) may be modified in accordance with a required potential value of the reference voltage Vr2. If desired, the first and second reference voltage Vr1 and Vr2 may be the same as each other; in such a case, the circuit 44 of FIG. 3 acts as the first and second reference voltage generators.

The control signal $\phi 1$ may merely be the power supply voltage Vcc, when the reference voltage Vr1 is potentially lower than a potential level Vcc-Vtq1, where "Vtq1" represents the threshold value of transistor Q1. When voltage Vr1 is higher than voltage Vcc, a charge-pump circuit 48 of FIG. 4 may be employed to generate as the control signal $\phi 1$ a higher voltage than the power supply voltage Vcc. Circuit 48 includes carrier-storage capacitors C11 and C12, an N-channel MOSFET Q15 for timely driving the charge operation of capacitor C11, and charge-transfer devices which may be diode-connected N-channel MOSFETs Q16 and Q17. Complementary clock signals $\phi r$, $\overline{\phi r}$ are supplied by a ring-oscillator circuit (described later) to capacitors C11 and C12. By supplying control signal $\phi 1$ to the gate electrode of the charging MOSFET Q1 of FIG. 2, the node N1 may be effectively pre-charged up to the reference voltage Vr1 without any potential decrease in the threshold voltage of transistor Q1.

The word-line drive operation of the embodiment is as follows. As shown in FIG. 5, the control signal $\phi 2$ is at the "H" level at a time point t0 before an address is determined. A potential Vn2 on node N2 of capacitor C2 is kept at the "L" level. Responding to the first control signal $\phi 1$, the charge-up MOS transistor Q1 turns on causing node N1 to be charged up toward reference voltage Vr1. After the address is determined, the second control signal $\phi 2$ drops from "H" level to "L" level at a time t1. P-channel MOS transistor Q2 thus turns on, while N-channel MOS transistor Q3 is kept turned off. The second reference voltage Vr2 is applied via transistor Q2 to node N2. A booted voltage is developed on node N1 due to a capacitive coupling of capacitor C2. This booted voltage is then transferred to a presently selected word line WLi through word-line drive line WDRV, and decoder transistors Q4 and Q5 for selectively turning on in response to clock signals $\phi 3$ and $\phi 4$. The voltage Vwd on the selected word line WLi-it will be referred to as the "booted word-line drive voltage"-goes up to "H" level. It is now permitted for memory cells M1, M2, . . . associated with word line WLi to access datacarriers using the "H" level voltage between the cells and bit lines BL in accordance with a known scheme.

With the circuit arrangement of FIG. 2, the booted word-line drive voltage Vwd may be equal to:

$$Vwd = \frac{Vr1 \cdot (C2 + C3) + Vr2 \cdot C2}{C1 + C2 + C3} \quad . \tag{2}$$

If the first and second reference voltages Vr1 and Vr2 are identical with each other, drive voltage Vwd may be simplified as presented below:

$$Vwd = \frac{Vr1 \cdot (2C2 + C3)}{C1 + C2 + C3} \quad . \tag{3}$$

As can be seen from Equations 2 and 3, the booted word-line drive voltage Vwd is determined by first and second reference voltage Vr1 and Vr2 that are potentially independent of the power supply voltage Vcc externally supplied to the DRAM 10. In other words, booted word-line drive voltage Vwd can hold a desired constant potential level regardless of any potential variation in voltage Vcc. This can be supported by the fact that voltage Vwd is kept unchanged in the allowable range of voltage Vcc defined between the minimum and maximum levels Vccmin and Vccmax shown in the graph of FIG. 6. Drive voltage Vwd of constant potential is potentially higher in magnitude than the "H" level voltage on the bit lines BL, which increases proportionally as voltage Vcc increases, when voltage Vcc is at the minimum level Vccmin; and, at the same time, voltage Vwd is successfully set at a suitable potential level that is lower than the dielectric breakdown voltage of memory cell transistors 42 when voltage Vcc is at the maximum level Vccmax. This enables a sufficient "H" level data to be written when the power supply voltage Vcc drops to its maximum level Vccmin, and can also prevent unnecessary stress from being given to the gate insulation thin film of the cell transistors. The time dependent dioxide breakdown (TDDB) can be successfully eliminated in the cell transistors; the operation reliability of DRAM 10 can thus be improved.

It should be noted in FIG. 2 that both of the first and second reference voltage generators 44 and 46 are not necessarily provided, and that in some cases only one of these reference voltage generators may be used in the booster circuit 26. Exemplary circuit arrangements are shown in FIGS. 7 and 8. The circuit of FIG. 7 is similar to that of FIG. 2 except that the voltage Vr2 is replaced with the power supply voltage Vcc. Alternatively, the circuit of FIG. 8 is similar to that of FIG. 2 except that voltage Vr1 is replaced by the power supply voltage Vcc. Voltage Vwd in FIG. 7 may be represented by:

$$Vwd = \frac{Vr1 \cdot (C2 + C3) + Vcc \cdot C2}{C1 + C2 + C3} \quad . \tag{4}$$

The same voltage in FIG. 8 is given as:

$$Vwd = \frac{Vcc \cdot (C2 + C3) + Vr2 \cdot C2}{C1 + C2 + C3} \quad . \tag{5}$$

While the circuits of FIGS. 7 and 8 are lesser than the previously described embodiment in the "non-dependency" feature of the booted word-line drive voltage Vwd upon the power supply voltage Vcc; however, these circuits still can exhibit enough merits in the practical application. The characteristic graph of the booted word-line drive voltage Vwd versus power supply voltage Vcc in each case is shown in FIG. 9.

Another embodiment of the present invention is shown in FIG. 10, wherein the embodiment includes a unique circuit 50, which compensates for variation in the booted word-line drive voltages Vwd due to unintentional variation in the manufacturing process conditions among DRAM chips. Circuit 50 is functionally equivalent to the reference voltage generators 44 and 46 of the FIG. 2. It can be said that circuit 40 is a circuit for generating a specific reference voltage Vr that compensates for or "absorbs" variation in the process parameters of the manufacturing process of DRAMs.

As shown in FIG. 10, the circuit 50 includes two voltage generator circuits 52a and 52b. Circuit 52a generates a first voltage Vc1 the potential of which is proportional accurately to the thickness of the actually manufactured gate insulation films of the memory cell transistors, and is not dependent on the power supply voltage Vcc. Voltage Vc1 thus indicates the actual dielectric breakdown voltage on the DRAM chips manufactured. This voltage will be referred to as the "Tox-voltage," circuit 52a will be called the "Tox-voltage generator" for purposes of explanation, where the suffix "ox" stands for oxide. The other voltage generator circuit 52b generates a second voltage Vc2, which potentially represents the actual threshold voltage (a varied value if the threshold voltage is varied) of the memory cell transistors. This voltage Vc2 will be referred to as the "vth-voltage," and circuit 52b as the "vth-voltage generator", where the suffix "th" stands for threshold. Tox-voltage generator 52a is connected at its output to an amplifier circuit 54a. Circuit 54a includes an operational amplifier OP1, a P-channel MOS transistor Q211 the gate electrode of which is connected to the output of amplifier OP1, and a series circuit of voltage-dividing resistors Ra1 and Rb1. Transistor Q211 and resistors Ra1, Rb1 are connected in series between the power supply voltage Vcc and the ground potential. The potential on a common node of resistors Ra1 and Rb1 is fed back to the non-inverting input of amplifier OP1. Voltage Vc1 is introduced to the inverting input of amplifier OP1; an amplified voltage appears at the output thereof. The drain electrode of transistor Q211 acts as the output of circuit 54a.

On the other hand, the vth-voltage generator 52a is connected to an amplifier 54b. Similarly, circuit 54b includes an operational amplifier OP2, a P-channel MOS transistor Q212 having its gate electrode connected to the output of amplifier OP2, and a series circuit of voltage-divider resistors Ra2 and Rb2. A common node of these resistors Ra2 and Rb2 is fed back to the non-inverting input of amplifier OP2. When voltage Vc2 is input to the inverting input of amplifier OP2, the amplified output voltage of this amplifier is applied to the gate electrode of transistor Q212, functioning as the output of circuit 54b. The outputs of circuits 54a and 54b are connected together at a circuit node 56. Naturally, the potential at node 56 is equal to one of the amplified output voltage Va1 and Va2 of amplifier circuits 54a and 54b which is potentially greater in magnitude than the other.

The Tox-voltage generator 52a may be arranged employing any one of the circuit arrangements shown in FIGS. 11A through 11F. The circuit of FIG. 11A includes three diode-connected N-channel MOSFETs Q31, Q32, and Q33. One end of diode-connected transistors is connected through a load resistor R2 to the power supply voltage Vcc; the other end thereof is connected to the ground potential. Transistors Q31, Q32, and Q33 may be MOSFETs that have silicon gate electrodes of N conductivity type and non-doped channel regions. Transistors Q31, Q32, and Q33 may also be N-channel MOSFETs having ion-doped channel regions wherein the threshold voltage is substantially proportional to the thickness of gate insulation thin-film layer. The resistance value of load resistor R2 is sufficiently greater than those of transistors Q31, Q32, and Q33. Assume that the power supply voltage Vcc is potentially higher than the total value of the threshold voltages of three diode-connected transistors Q31, Q32, and Q33. In this case, At the output of this circuit, a voltage of the total threshold voltage value appears as the Tox-voltage Vc1 indicative of the actual thickness of gate insulation film.

The generation of the voltage Vc1 will be performed as described below. Generally, the threshold value Vth of N-channel MOSFET having an insulated gate electrode made of N-conductivity type semiconductor material and a non-doped channel region may be defined as follows:

$$Vth = -Vfb + 2\phi f + \gamma(\phi f + Vsub)^{1/2} \cdot Tox, \quad (6)$$

where Vfb is the flat-band voltage, $\phi f$ is the Fermi level, $\gamma$ is a factor of proportionality, Vsub is a chip substrate-bias voltage, and Tox is the thickness of gate insulation film. With the type of N-channel MOSFET the following relationship is generally defined:

$$|-Vfb + 2\phi f| << \gamma(\phi + Vsub)^{1/2} \cdot Tox. \quad (7)$$

Therefore, voltage Vth is essentially proportional to the thickness Tox of gate insulation film. This can be understood from viewing a line Vth(Tox) in the graph of FIG. 12 to be presented later. In the reference voltage generator circuit of FIG. 11A, if the power supply voltage Vcc is higher than a preselected potential level, voltage Vc1 that is accurately proportional to Tox regardless of the actual value of voltage Vcc may be obtained. Voltage Vc1 in this case is equal to:

$$Vc1 = K \cdot Tox \quad (8)$$

where K is a factor of proportionality.

The reference voltage generator of FIG. 11B is different from that of FIG. 11A in the substrate-bias condition for the diode-connected MOS transistors Q31, Q32, and Q33. These transistors are connected together to the ground potential. The Tox-voltage Vc1 in this circuit may be defined similarly by Equation 6 except the fact that the value of $\gamma(\phi + Vsub)^{1/2}$ is different. Equation 8 is also effective with respect to this voltage Vc1.

As can be seen from Equation 8, the voltage Vc1 thus generated has no concern with the number of diode-connected transistors being used. This may permit the circuit of FIG. 11A or 11B to be modified to use a single MOSFET Q31 as shown in FIG. 11C. With the circuits of FIGS. 11A to 11C, each N-channel MOS transistor has a non-doped channel region; it can thus be said that almost all the process parameters (ion injection condition, its temperature, etc.) but the gate insulation film thickness will not vary. Voltage Vc1 is potentially stable.

In the circuit arrangements of FIGS. 11A to 11C, MOSFETs Q31, Q32, and Q33 may also be those with ion-injected channel regions. If this is the case, it is recommendable that the ion injection condition is so arranged that deviation $\Delta fb$ in flat band voltage Vfb due to the execution of ion injection satisfies the following condition:

$$-Vfb + \Delta fb + 2\phi f \sim 0. \quad (9)$$

With such an arrangement, it is possible, even when MOSFETs with ion-injected channel regions are used, to produce Tox-voltage Vc1 which is proportional to the thickness of ion-injected gate insulation thin-film of MOSFETs. If the gate electrodes of diode-connected N-channel MOSFETs Q31, Q32, and Q33 are made of P-type semiconductor material, the threshold voltage may be represented as follows:

$$Vth = Vfb + 2\phi f + \gamma(\phi f + Vsub)^{1/2} \cdot Tox. \quad (10)$$

The ion-injecting condition in this case is same as that of the above case.

The circuit of FIG. 11D differs from that of FIG. 11C in that it uses a P-channel MOS transistor Q34 having P-type gate electrode and a non-doped channel region. The threshold voltage Vth of transistor Q34 is given by $$Vth = -Vfb + 2\phi f - \gamma(\phi f + Vsub)^{1/2} \cdot Tox. \quad (11)$$

Where Tox is sufficiently large, the following relation will be given:

$$|-Vfb + 2\phi f| << \gamma(\phi f + Vsub)^{1/2} \cdot Tox. \quad (12)$$

The resultant voltage Vc1 will be proportional to the thickness of gate insulation thin film of transistor Q34. P-channel MOS transistor Q34 with P-type gate electrode, as well as an N-channel MOS transistor with N-type gate electrode, is less in variation in the manufacturing parameters other than one parameter of gate insulation film thickness. This results in voltage Vc1 being less in the power-supply voltage dependency and thus significantly stable.

If P-channel MOSFET Q34 has an N-type gate electrode, and when its channel region is not doped with any impurity by ion injection, the threshold voltage vth may be defined by $$Vth = Vfb + 2\phi f - \gamma(\phi f + Vsub)^{1/2} \cdot Tox. \quad (13)$$

Figure 12:
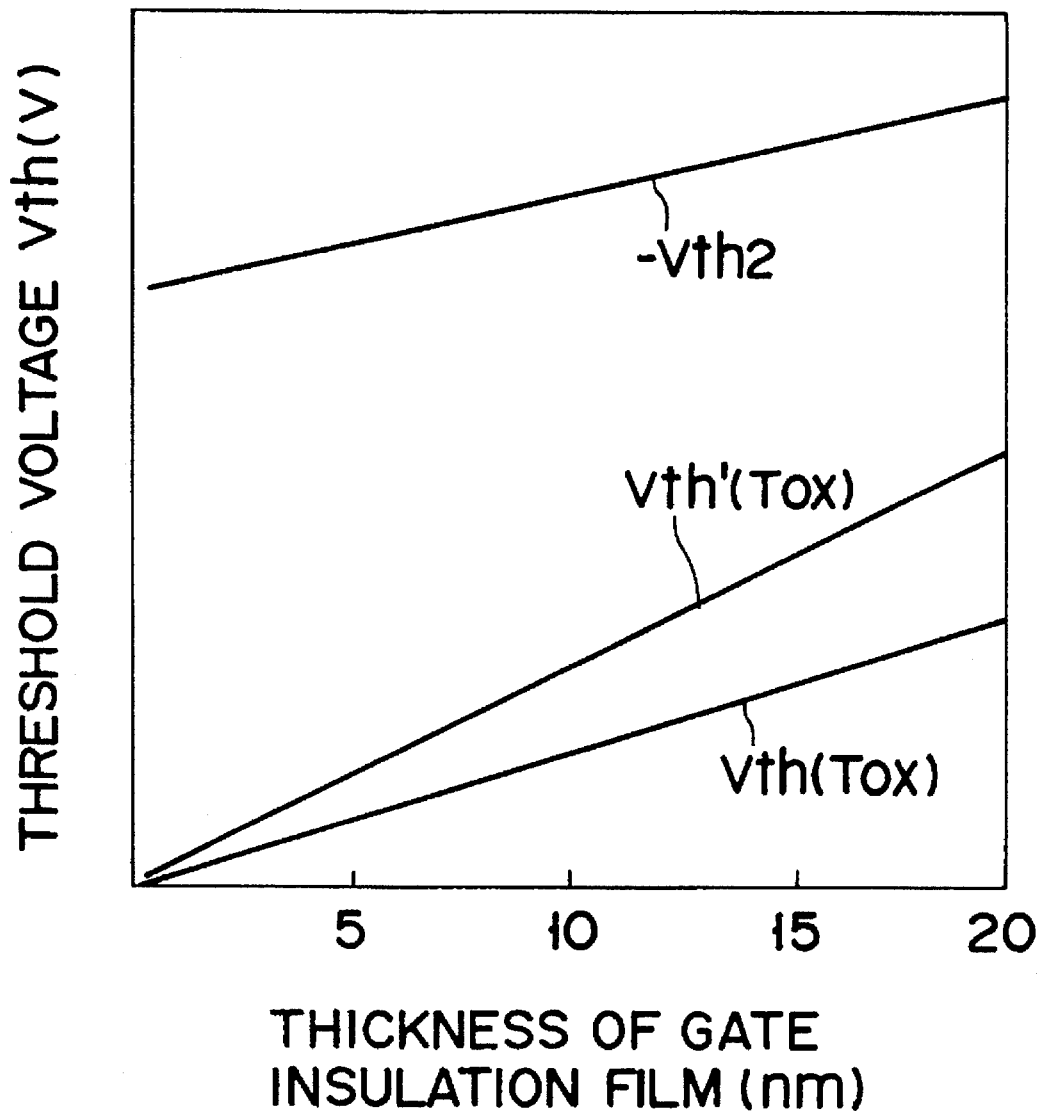
FIG. 12 is a graphic representation of potential levels of threshold voltages versus gate insulation film thickness in the embodiment arranged as shown in FIGS. 10 and 11.

This represents that the vth voltage is not proportional to the gate insulation film thickness; it is also shown by line "–Vth2" in graph of FIG. 12. Even in this case, by doping a certain impurity such as boron into the transistor channel region, a flat-band deviation $\Delta Vfb$ may be generated which satisfies the following condition:

$$|Vfb + 2\phi f - \Delta Vfb| \sim 0. \quad (14)$$

A suitable voltage to be used as voltage Vc1 can thus be developed. Similarly, in the case of using a P-channel MOSFET with P-type gate electrode, a series circuit of a plurality of diode-connected MOSFETs may be employed to constitute reference voltage generator 54a in a same manner as in the case of N-channel MOSFET(s).

The circuits of FIGS. 11E and 11F may be obtained by modifying the circuit of FIG. 11C so that load resistor R2 is replaced with either N-channel MOSFET Q35 or P-channel MOSFET Q36. To obtain greater load resistance, these transistors Q35 and Q36 are arranged to meet the condition that follows:

$$Wch/Lch << 1, \quad (15)$$

where Wch represents channel width, and Lch is channel length. With such an arrangement, a suitable voltage Vc1 can be generated which is successfully proportional to the gate insulation film thickness, in the same manner as in the prior case of FIG. 11C.

Circuits shown in FIGS. 13A–13D are preferably used for the second Vth-voltage generator 52a of FIG. 10. With the FIG. 13A circuit, an N-channel MOS transistor Q41 is so formed as to have the same shape as the previously described memory cell transistors M1, M2, ... of DRAM 10 (see FIG. 2) using a similar manufacturing process. Transistor Q41 is connected in series with resistors R3 and R4 between the power supply voltage Vcc and the ground potential. The resistance values of resistors R3 and R4 are sufficiently greater than that of MOSFET Q41. The output voltage that appears at one current carrying electrode of MOSFET Q41 as the vth-voltage Vc2 is substantially equal to:

$$Vc2 = \frac{(Vcc - Vtc)R3}{R3 + R4} + Vtc \qquad (16)$$

$$= \left(\frac{R3}{R3+R4}\right)\left(Vcc + Vtc\frac{R3}{R4}\right),$$

where Vtc is the threshold voltage of MOSFET Q41. From Equation 16, the following fact may be understood: voltage Vc2 depends on the power supply voltage Vcc and varies as the gate threshold voltage Vtc of MOSFET Q41 varies.

The circuit of FIG. 13B is provided by slightly modifying the substrate bias condition of MOS transistor Q41 in the FIG. 13A circuit. In this case, only the threshold voltage of transistor Q41 is different; the others are similar to the previously explained circuits. The relationship defined by Equation 14 is kept effective. The FIG. 13C circuit is similar to that of FIG. 13A except that the coupling positions of transistor Q41 and resistor R4 are reversed. The resultant voltage Vc2 is absolutely the same as that in the FIG. 13A circuit.

The circuit shown in FIG. 13D is similar to that of FIG. 13A with MOSFET Q41 being replaced with a plurality of parallel-connected MOSFETs. These transistors are almost the same in the manufacturing process conditions thereof as the memory cell transistors 42 that have been micro-fabricated in highly integrated DRAM 10. Also in this case, voltage Vc2 may be defined by Equation 14.

Turning now to FIG. 10, the circuit 50 operates as follows. The Tox-voltage Vc1 and vth-voltage Vc2 are amplified by operational amplifiers OP1 and OP2, respectively. The amplified output voltage Va1 of amplifier OP1 is $$Va1 = \frac{(Ra1 + Rb1)K\,Tox}{Rb1} \qquad (17)$$

The amplified output voltage of amplifier 54b is given by $$Va2 = \left(\frac{Ra2 + Rb2}{Rb2}\right)\left(\frac{R3}{R3+R4}\right)\left(Vcc + Vtc\frac{R3}{R4}\right). \qquad (18)$$

Figure 14:
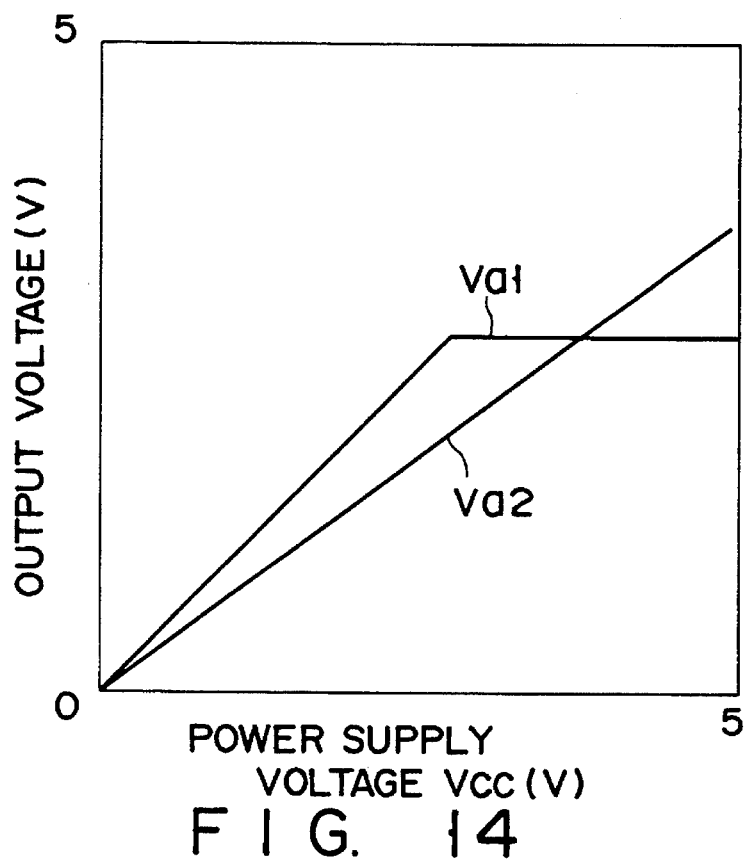
FIG. 14 is a graphic representation of output voltages of the voltage generators versus power supply voltage Vcc in the above embodiment.

The relationship between voltages Va1, Va2 and power supply voltage Vcc is shown in a graphic illustration of FIG. 14. It is to be understood from viewing FIG. 14 that voltage Va1 can be kept constant when power supply voltage Vcc is larger than a specific potential level, and that voltage Va2 increases as power supply voltage Vcc increases. Voltage Va2 is proportional to voltage Vcc and the threshold voltage of the MOS transistor. As previously mentioned, the voltage potential at wired output node 56 acting as first reference voltage Vr1 is equal to one of voltages Va1 and Va2 which is higher than the other; it changes as typically shown in a graph of FIG. 15.

The reference voltage Vr1 generated by the FIG. 10 circuit is applied to the MOS transistor Q1 in the booster circuit 26 shown in FIG. 2. The booted wordline drive voltage Vwd in this case is as follows: voltage Va1 is charged at bootstrap capacitor C2 (FIG. 2). When the charge-up voltage of capacitor C2 is applied to a selected word line WLi, voltage Vwd may be defined by:

$$Vwd = \left(\frac{2C1}{C1+C2}\right)\left(\frac{Ra1+Ra2}{Rb1}\right)K\,Tox. \qquad (19)$$

It should be noted in Equation 19 that the capacitance C3 of FIG. 2 is ignored since it is very small. Consideration is directed only to voltage Va2 defined by Equation 18, word-line drive voltage Vwd is given as follows:

$$Vwd = \qquad (20)$$

$$\left(\frac{2C1}{C1+C2}\right)\left(\frac{Ra2+Ra2}{Rb2}\right)\left(\frac{R3}{R3+R4}\right)\left(Vcc+Vtc\frac{R3}{R4}\right).$$

Of the voltages defined by Equations 16 and 17 greater one is specifically applied to a selected word lines WLi as the booted word-line drive voltage Vwd.

Figure 15:
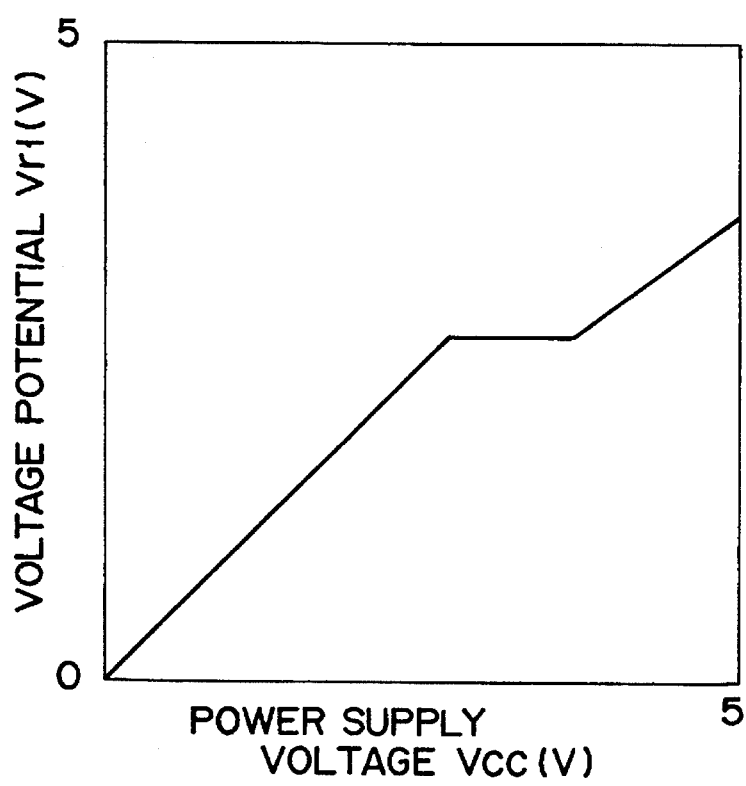
FIG. 15 is a graphic representation of the first reference voltage Vr1 versus power supply voltage Vcc in the embodiment.
Figure 17:
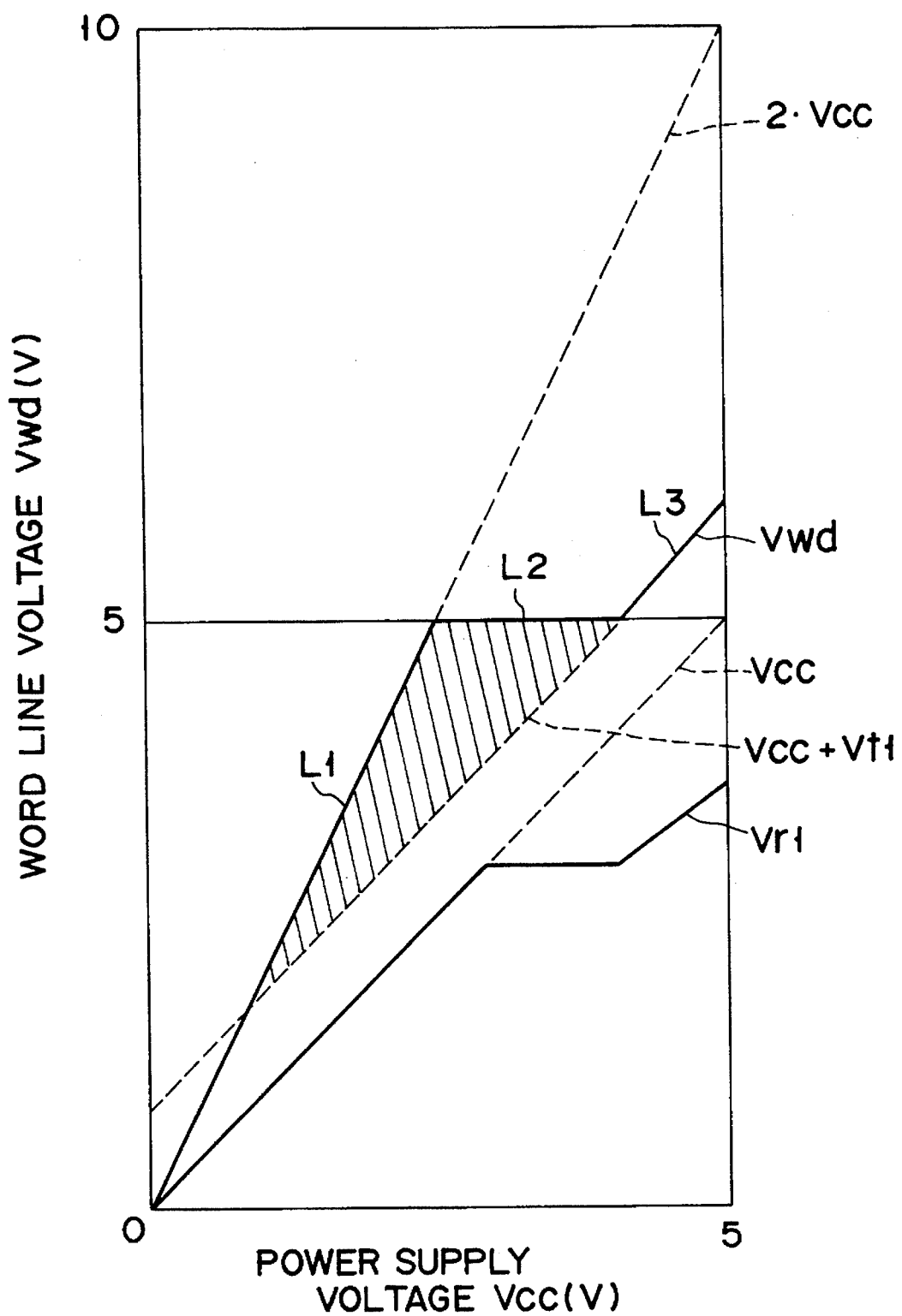
FIG. 17 is a graphic representation of word line voltage Vwd versus power supply voltage in accordance with the embodiment.

It will be understood from FIG. 16 that the characteristic line of FIG. 15 varies so as to compensate for variations in the gate insulation thickness Tox and its threshold voltage Vth caused in the memory cell transistors due to deviation in the manufacturing process of DRAMs. Assume that Tox and Vth increase for purpose of explanation. To compensate for this, the potential level in the flat region of reference voltage Vr1—it is a voltage region corresponding to the constant potential of voltage Va1 in FIG. 14—increases as shown in a hatched portion 58.

with the embodiment including the booster circuit 26 that employs the reference voltage generator of FIG. 10, the dependency of word-line drive voltage Vwd on the power supply voltage Vcc is as shown by fat lines L1, L2, and L3 in the graph of FIG. 17. Voltage Vwd is maximum when reference voltage Vr1 is potentially equal to the power supply voltage Vcc, and C1>>C2. This may indicated by line L1; line L1 shows that voltage Vwd increases proportionally to voltage Vcc only and that voltage Vwd is not concerned at all with, or potentially independent of, variation in voltage Va1. In FIG. 17, line L2 constantly maintains at 5 volts may correspond to the flat portion of voltage Va1 in FIG. 14, i.e., the region in which the voltage depends on the gate insulation thickness Tox of MOS transistor only. When voltage Vcc further increases, drive voltage Vwd increases, as shown by line L3, depending on both of voltage Vcc and the threshold voltage in accordance with the potential level of reference voltage Va2.

The advantages of this embodiment are as follows. The maximum electric field of TDDB is represented by "Emax," it is given as $$Emax = K\left(\frac{2C1}{C1+C2}\right)\left(\frac{Ra1+Rb1}{Rb1}\right). \qquad (21)$$

Combining Equations 20 and 21 results in the following equation:

$$Vwd = Emax \cdot Tox. \qquad (21)$$

Equation 22 clearly shows that word-line drive voltage Vwd is purely defined by the product of Emax and Tox. More specifically, while voltage Vcc varies, flat portion L2 of voltage Vwd in the graph of FIG. 17 is kept constant at the TDDB limit; moreover, voltage Vwd changes proportionally to variations in the Tox value. Therefore, this embodiment can successfully compensate for variations in gate insulation film thickness Tox of memory cell transistors 42 due to deviation in the manufacturing process parameters, as well as the potential decrease in the previously described embodiment.

Additionally, this embodiment may permit the wordline drive voltage voltage Vwd to rise toward the limit Value of booster circuit 26, i.e., 2Vcc, if C1 is sufficiently greater than C2(C1>>C2), and the power supply voltage Vcc is less than (Emax·Tox)/2. The above discussion may be summarized such that, even when gate insulation film thickness Tox varies undesirably, voltage Vwd increases up to 2Vcc when 2Vcc>Emax·Tox, or is kept constant at Vwd= Emax·Tox2Vcc when 2Vcc≦Emax·Tox. With such an automatic "Tox variation absorbing" feature, it becomes possible to eliminate decrease in the operation reliability of DRAM 10 due to the TDDB problem, and also to guarantee to provide enough margin for "H" level data write operation in any memory cell(s) in the entire allowable region of the power supply voltage Vcc. Since the potential of wordline voltage Vwd is sufficiently high, the speed of read operation can also be improved. In addition, it makes it possible to compensate for undesirable variation in Tox of cell transistors 42 in the manufacture of DRAM 10.

In Equation 20 if the following relationship is satisfied, $$\left(\frac{2C1}{C2+C2}\right)\left(\frac{Ra2+Ra2}{Rb2}\right)\left(\frac{R3}{R3+R4}\right)=1,$$

Equation 20 may be simplified as follows:

$$Vwd=Vcc+Vtc\cdot R3/R4. \quad (23)$$

This equation shows that, even when the value of R3/R4 is modified, the condition of Equation 23 can be obtained by changing the value of (Ra2+Rb2)/Rb2. The word-line drive voltage Vwd that is required when an "H" data is written into a certain memory cell of DRAM 10 is given as $$Vwd=Vcc+Vt1, \quad (24)$$

where Vt1 represents the threshold voltage of cell transistor 42. With the booster circuit 26 employing the circuit of FIG. 13A, MOS transistor Q41 and cell transistors 42 are the same as each other in their manufacturing process conditions, size, shape, and so forth; the two are different from each other in the substrate bias voltages only. The substrate bias voltage Vsub of the memory cell array is substantially equal to $$Vsub1=Vcc+Vbb, \quad (25)$$

where Vbb is a well potential. The substrate bias voltage Vsub2 of MOS transistor Q41 is $$Vsub2=(Vcc-Vtc)\,R3/(R3+R4). \quad (26)$$

From Equations 24 and 25 it is seen that Vsub1>Vsub2. The relationship of Vtc<Vt1 is obtained. Such a threshold value difference is modified by modifying the value of R3/R4, and $$Vt1-Vtc\,R3/R4 \quad (27)$$

is defined, then a booted word-line drive voltage Vwd can be introduced which is defined by $$Vwd-Vcc+Vt1. \quad (28)$$

The same goes with the cases of FIGS. 13B and 13C, except the difference in their substrate-bias voltage settings with such an arrangement, the "H" data write efficiency into a selected memory cell can be held higher, and Tox variation can be automatically compensated for in memory cell transistors 42. This may provide some merits to an accelerated test for DRAM 10, i.e., the reliability test of DRAM 10 using a test voltage that is forced to rise potentially. Such test can be executed by making use of the above embodiment circuit arrangement and utilizing a region defined by the increasing characteristic line L3 of FIG. 17. A hatched region of triangle shape in FIG. 17, which is defined by fat, broken line L1, L2, L3, and a line (Vcc+Vt1) representing the minimum necessary voltage for "H" data write, is the region in which sufficient operation margin can be guaranteed. This region is wider than that in the prior art devices; the operation margin can be improved accordingly.

A leakage compensator circuit in accordance with the third embodiment of the present invention is shown in FIG. 18, wherein the circuit may be additionally provided inside DRAM 10 so as to cooperate with any one of the previously explained first and second embodiments is generally designated by reference numeral "60." Circuit 60 is for actively compensating for variations in the word-line drive voltage Vwd due to current leakage on the word lines WL—for example, at the drain electrodes of memory cell transistors 42—within DRAM 10.

As shown in FIG. 18, the drive voltage Vwd generated by booster circuit 26 is then introduced to the first input of a voltage comparator circuit 62. Comparator 62 has a second input to which a reference voltage Vref representing a standard potential that is preferable for voltage Vwd. Comparator 62 generates a voltage signal Vro that represents the comparison results between voltages Vwd and Vref. Signal Vro is then input to a ring-oscillator 64. Oscillator 64 is connected to a charge-pump circuit 66. The operation of charge-pump circuit 66 is controlled in response to the output of ring-oscillator 64.

As shown in FIG. 19, the comparator 62 includes N-channel MOS transistors Q51 and Q53 having gate electrodes connected together to ON/OFF control input Vsw. These transistors may selectively turn on and off in response to control voltage signal Vsw. Transistor Q51 is connected with a series circuit of resistors R11 and R12, having one end connected to word line voltage input Vwd; similarly, transistor Q52 is connected with series-connected resistors R13 and R14 having one end connected to reference voltage input Vref. N-channel MOS transistors Q53 and Q54 have gate electrodes respectively connected to resistor common nodes Nr1, Nr2 and source electrodes connected together. P-channel MOS transistors Q55 and Q56 are respectively connected to transistors Q53 and Q54 to selectively supply them with necessary current. A series circuit of N-channel switching MOS transistors Q57 and Q58 is connected to the source electrodes of transistors Q53 and Q54. Transistor Q57 has its gate electrode to which control signal Vsw is supplied; transistor Q58 receives at its gate electrode another switching control voltage signal Vm. Transistors Q53, Q54, Q55, Q56, Q57, and Q58 constitute a current-mirror type CMOS differential amplifier.

The gate electrode of transistor Q53 acts as the first input of the comparator 62; a voltage divided by resistors R11 and R12 from word line voltage Vwd is supplied to it. A voltage divided by resistors R13 and R14 from voltage Vref is applied to the gate electrode of transistor Q54, which may serve as the second input of comparator 62. The output of the CMOS differential amplifier appears at node Nq, and is transmitted as a ring-oscillation control signal Vro to ring-oscillator 64 via P-channel MOS transistor Q59 and an output buffer 68. Transistor Q59 is connected at its drain electrode with power supply voltage Vcc, and connected at the source electrode thereof to ground potential through an N-channel MOS transistor Q61. The gate electrodes of transistors Q58 and Q61 are connected with each other, so that control signal Vm is supplied to the two transistors. A P-channel MOS transistor Q60 is connected between the gate and drain electrodes of transistor Q59; it has a gate electrode connected to signal Vsw.

The exact potential on an actually selected word line WLi inside DRAM 10, or the potential on a pseudoword line-obviously, this line is under the same load condition as the word lines WL-additionally arranged in DRAM 10 may be used as the word-line drive voltage Vwd supplied to the comparator 62. The output voltage Vr1 of circuit 22 shown in FIG. 2 may be employed as the reference voltage Vref therefor. The values of voltage-divide resistors R11, R12, R13, and R14 are designed so that the ring-oscillator control signal Vro goes high when voltage Vwd drops below a predetermined potential level.

The ring-oscillator 64 may be constituted as shown in FIG. 20, wherein a plurality of series-connected CMOS inverters 70 are associated with a series circuit of MOS transistors Q71, Q72, and Q74 with an N-channel MOS transistor Q73 having a gate electrode connected to that of transistor Q74. The control signal Vro is supplied to the gate electrode of transistor Q74 via a CMOS inverter 72. The gate electrodes of transistors Q71 and Q72 are connected together to the output of the last-stage inverter.

The current leakage compensator 60 performs a compensation function as follows. Comparator 62 is kept inoperative while switching control signals Vsw and Vm are at "L" level. At this time, output transistor Q60 is rendered conductive, so that transistor Q59 turns off since its gate and drain electrodes are tied together by transistor Q60. Transistor Q61 is kept nonconductive. Ring-oscillator control signal Vro is thus at "L" level. Transistors Q73 and Q74 in ring-oscillator 64 turn off; accordingly, oscillator 64 does not exhibit any oscillation.

When signals Vsw and Vm go high, comparator 62 becomes active. If word line voltage Vwd is higher than a preselected potential level, the output voltage of the differential amplifier in comparator 62 is at "H" level. Transistor Q59 thus turns off. Transistor Q61 turns on, so that voltage Vro is continuously held at "L" level. As voltage Vwd becomes less than the preselected potential level, the output voltage of the differential amplifier goes low. As a result, transistor Q59 turns off. The turn-on resistances of transistors Q59 and Q61 have been suitably designed to satisfy a predetermined relationship, transistor Q59 may be turned on, causing voltage Vro to go high. With such a change in potential level in voltage Vro, ring-oscillator 64 becomes activated. An oscillation gets started therein to provide suitable clock signals $\phi r$ and $\overline{\phi r}$. Responding to the oscillation, charge-pump circuit 66 is driven to cause word line voltage generator (26 in FIG. 2) to become operative. Thus, the decreased voltage on a selected word line WLi can be increased toward a desirable standard potential level corresponding to voltage Vref.

It is possible with the third embodiment circuit arrangement to cause the actual voltage on any word line WLi to be held at the desired potential level, by compensating for any accidental potential drop due to current leakage inherent to the word lines. This can further improve the operating reliability of DRAM 10, while the selective activation of ring-oscillator 64 causes power consumption therefor is kept minimum.

The comparator 62 may be modified as shown in FIG. 21, wherein the voltage-dividing resistor R12 in FIG. 19 consists of a couple of resistors R12a and R12b. An N-channel MOS transistor Q62 is added to have one of source and drain electrodes connected to the common node Nr3 of resistors R12a and R12b, and its gate electrode connected to voltage Vro output. Transistor Q62 selectively turns on and off in response to voltage Vro; when turning on, node Nr3 is connected to ground potential.

With the circuit of FIG. 21, a specific "insensitive zone" is defined in the current leakage compensation operation. More specifically, while the booted word-line drive voltage Vwd is higher than the preselected potential level, and voltage Vro is at the "L" level, transistor Q62 is rendered nonconductive. The voltage-dividing ratio on the side of word lines is R11/(R12a+R12b). A voltage to be input to the differential amplifier circuit is given as $$Vin = Vwd \cdot (R12a + R12b) / (R11 + R12a + R12b). \qquad (29)$$

When voltage Vin drops from the preselected potential level, comparator 62 begins operating. Control signal Vro goes high. Oscillation gets started in ring-oscillator 64. When voltage Vro is at the "H" level, transistor Q62 turns on. The voltage-dividing ratio at this time is R11/R12a. Therefore, the input voltage Vin is substantially equal to $$Vin = Vwd \cdot R12a / (R11 + R12a + R12b). \qquad (30)$$

After ring-oscillator 64 begins oscillating, input voltage Vin of the differential amplifier is prevented from changing to the "H" level even when the voltage on the selected word line WLi recovers its potential level. Responding to this, the ring-oscillator continues to oscillate for a while. This fact supports the existence of the insensitive zone. It is thus possible to prevent the selected word line WLi from being subjected to unwanted secondary oscillation during the leakage-compensation.

The present invention is not limited to the above-described specific embodiments and may be practiced or embodied in still other ways without departing from the spirit or essential character thereof.

What is claimed is:

1. A random-access memory comprising:

an array of rows and columns of memory cells, each of which has a data storage capacitor and a data transfer transistor;

bit lines associated with said memory cells at current carrying electrodes of said transistors;

word lines associated with said memory cells at control gates of said transistors; and a driver circuit coupled with said word lines, for receiving a power supply voltage of said memory, for generating a specific potential-increased voltage of a preselected potential level that is essentially insensitive to variation in the power supply voltage during an operation of said memory, and for supplying a selected word line with the specific voltage as a drive voltage therefor, said driver circuit including at least one capacitor having a first insulated electrode and a second insulated electrode, and a circuit for supplying a regulated voltage, which is substantially independent of variation in the power supply voltage, to at least one of said first insulated electrode and second insulated electrode.

2. A random access memory comprising:

an array of rows and columns of memory cells, each of which has a data storage capacitor and a data transfer transistor;

bit lines associated with said memory cells at current carrying electrodes of said transistor;

word lines associated with said memory cells at control gates of said transistors; and a drive circuit coupled with said word lines, for receiving a power supply voltage of said memory, for generating a specific potential-increased voltage of a preselected potential level that is essentially insensitive to variation in the power supply voltage during an operation of said memory, and for supplying a selected word line with the specific voltage as a drive voltage therefor, wherein said driver circuit comprises:

a charge-up capacitor having a first and a second insulated electrodes;

a first circuit connected to the first electrode, for supplying it with a first regulated d.c. voltage that is substantially independent of variation in the power supply voltage and holds a fixed potential; and a second circuit connected to the second electrode, for supplying it with a second regulated d.c. voltage that is substantially independent of variation in the power supply voltage and holds a fixed potential.

3. A memory according to claim 2, wherein said first circuit comprises:

at least one diode-connected metal-insulator-semiconductor field effect transistor connected at its one current carrying electrode to the power supply voltage; and an amplifier connected to the current carrying electrode of said field-effect transistor.

4. A memory according to claim 2, wherein said second circuit comprises:

at least one diode-connected metal-insulator-semiconductor field effect transistor connected at its one current carrying electrode to the power supply voltage; and an amplifier connected to the current carrying electrode of said field effect transistor.

5. A memory according to claim 2, wherein each of the first and second circuits comprises:

at least one diode-connected metal-insulator-semiconductor field effect transistor connected at its one current carrying electrode to the power supply voltage; and an amplifier connected to the current carrying electrode of said field effect transistor.

6. A memory according to claim 2, wherein at least one of the first and second circuits comprises:

a series circuit of diode-connected metal-insulator-semiconductor field effect transistors connected at its one end to the power supply voltage and the other end thereof to a ground potential; and an amplifier connected to said one end of the series circuit.

7. A memory according to claim 2, wherein at least one of the first and second circuits comprises:

dielectric breakdown compensator means for generating a constant d.c. voltage while the power supply voltage is less than a predetermined potential level, and for generating while the power supply voltage is greater than the predetermined potential level a linearly-variable voltage that is substantially proportional to variation in dielectric breakdown voltage in the data transfer transistor of the selected memory cell so as to compensate for deviation in the dielectric breakdown voltages among said memory cells.

8. A memory according to claim 2, further comprising:

an additional circuit means for detecting a current leakage component inherent in the selected word line, and for selectively providing said word line with a voltage that compensates for a detected current leakage component.

9. A memory according to claim 8, wherein said additional circuit means comprises:

a comparator circuit including a differential amplifier with a first input for receiving the actual voltage on said selected word line and a second input for receiving a reference signal representing a desired potential level on said word line;

a ring-oscillator circuit for oscillating in response to an output of said comparator; and a charge-pump circuit connected to said oscillator circuit.

* * * * *